US010854952B2

(12) United States Patent
Stevenson et al.

(10) Patent No.: US 10,854,952 B2
(45) Date of Patent: Dec. 1, 2020

(54) ANTENNA INTEGRATED WITH PHOTOVOLTAIC CELLS

(71) Applicants: Ryan Stevenson, Woodinville, WA (US); Nathan Kundtz, Kirkland, WA (US); Steven Linn, Hillsboro, OR (US); Bob Morey, Sammamish, WA (US); Tung Pham, Renton, WA (US)

(72) Inventors: Ryan Stevenson, Woodinville, WA (US); Nathan Kundtz, Kirkland, WA (US); Steven Linn, Hillsboro, OR (US); Bob Morey, Sammamish, WA (US); Tung Pham, Renton, WA (US)

(73) Assignee: KYMETA CORPORATION, Redmond, WA (US)

(*) Notice: Subject to any disclaimer, the term of this patent is extended or adjusted under 35 U.S.C. 154(b) by 659 days.

(21) Appl. No.: 15/584,247

(22) Filed: May 2, 2017

(65) Prior Publication Data
US 2017/0324148 A1 Nov. 9, 2017

Related U.S. Application Data

(60) Provisional application No. 62/331,355, filed on May 3, 2016.

(51) Int. Cl.
H01Q 1/24 (2006.01)
H01Q 21/06 (2006.01)
(Continued)

(52) U.S. Cl.
CPC ............ H01Q 1/241 (2013.01); G02B 5/32 (2013.01); H01L 31/04 (2013.01); H01L 31/042 (2013.01);
(Continued)

(58) Field of Classification Search
CPC .... H01Q 1/241; H01Q 21/065; H01Q 21/064; H01Q 21/0031; H01Q 19/067;
(Continued)

(56) References Cited

U.S. PATENT DOCUMENTS 5,864,316 A * 1/1999 Bradley ............ H04B 7/18571
342/359
2005/0001954 A1 1/2005 Stephenson et al.
(Continued)

FOREIGN PATENT DOCUMENTS

CN 101989626 * 3/2011 ............... G05D 3/00
JP 2000165128 6/2000
(Continued)

OTHER PUBLICATIONS

PCT Application No. PCT/US2017/030823, International Search Report and the Written Opinion, dated Aug. 8, 2017, 14 pgs.
(Continued)

Primary Examiner — Dimary S Lopez Cruz
Assistant Examiner — Bamidele A Jegede
(74) Attorney, Agent, or Firm — Womble Bond Dickinson (US) LLP

(57) ABSTRACT

A holographic antenna integrated with photovoltaic cells and method for use of the same are described. In one embodiment, the method for using an antenna comprises receiving position data indicative of an antenna aperture of an antenna after the antenna has been placed in a position to increase capture of solar energy by one or more photovoltaic (PV) structures integrated into a surface of the antenna aperture; and in response to the position data, electronically steering an array of antenna elements of the antenna to redirect a beam toward a satellite based on the position of the antenna while maintaining the position of the antenna for increased capture of the solar energy.

38 Claims, 19 Drawing Sheets

(51) Int. Cl.
*H01Q 19/06* (2006.01)
*H01Q 21/00* (2006.01)
*H02S 50/00* (2014.01)
*H02S 30/20* (2014.01)
*H01L 31/042* (2014.01)
*G02B 5/32* (2006.01)
*H01L 31/04* (2014.01)
*H04W 8/08* (2009.01)
*H04W 84/00* (2009.01)

(52) U.S. Cl.
CPC ....... *H01Q 19/067* (2013.01); *H01Q 21/0031* (2013.01); *H01Q 21/064* (2013.01); *H01Q 21/065* (2013.01); *H02S 30/20* (2014.12); *H02S 50/00* (2013.01); *H04W 8/08* (2013.01); *H04W 84/005* (2013.01)

(58) Field of Classification Search
CPC .......... H01Q 1/44; H01Q 1/38; H01Q 1/2291; H01L 31/04; H01L 31/042; G02B 5/32; H04W 84/005; H04W 8/08; H02S 30/20; H02S 50/00; Y02E 10/542
See application file for complete search history.

(56) References Cited

U.S. PATENT DOCUMENTS

| | | | |
|---|---|---|---|
| 2007/0240757 A1* | 10/2007 | Ren | B82Y 20/00 136/256 |
| 2009/0082065 A1 | 3/2009 | Kwak | |
| 2010/0187400 A1* | 7/2010 | Mazzarotto | F24S 23/77 250/203.4 |
| 2011/0011657 A1 | 1/2011 | Donnell et al. | |
| 2011/0030757 A1* | 2/2011 | Lin | H01L 31/022433 136/244 |
| 2011/0156948 A1* | 6/2011 | Berejik | H01Q 1/185 342/352 |
| 2012/0026067 A1* | 2/2012 | Parsche | H01L 31/02008 343/904 |
| 2012/0032847 A1* | 2/2012 | Baktur | H01Q 21/26 342/365 |
| 2012/0206310 A1* | 8/2012 | Apostolos | H01Q 13/28 343/771 |
| 2013/0009851 A1* | 1/2013 | Danesh | H01L 31/075 343/904 |
| 2013/0266319 A1* | 10/2013 | Bodan | H01Q 13/28 398/79 |
| 2013/0298964 A1* | 11/2013 | Nunez Bootello | H02S 40/44 136/246 |
| 2014/0261648 A1* | 9/2014 | Smith | H01L 31/035281 136/255 |
| 2015/0155396 A1* | 6/2015 | Cooke | H01L 31/0475 136/244 |
| 2015/0222014 A1* | 8/2015 | Stevenson | H01Q 13/18 342/372 |
| 2015/0222021 A1 | 8/2015 | Stevenson | |
| 2015/0236412 A1* | 8/2015 | Bily | H01Q 21/0012 342/374 |
| 2015/0236415 A1 | 8/2015 | Bily et al. | |
| 2015/0243817 A1* | 8/2015 | Cooke | H01L 31/108 136/244 |
| 2015/0288063 A1* | 10/2015 | Johnson | H01Q 3/24 342/352 |
| 2016/0156304 A1* | 6/2016 | Smadja | H02S 20/00 136/251 |
| 2016/0192163 A1* | 6/2016 | Miner | H04W 4/90 455/404.1 |

FOREIGN PATENT DOCUMENTS

| | | | | |
|---|---|---|---|---|
| JP | 2013009488 | * | 1/2013 | ............... H02J 3/00 |
| JP | 2013528963 | | 7/2013 | |
| WO | 2015179214 | | 11/2015 | |
| WO | 2015187739 | | 12/2015 | |

OTHER PUBLICATIONS

Japanese Office Action for Application No. 2018-557906 dated Mar. 23, 2020, 5 pages.
European Extended Search Report for Application No. 17793244.9-1220, dated Oct. 28, 2019, 15 pages.

* cited by examiner

AT ASM (ANTENNA SYSTEM) LEVEL:

ANTENNA INTEGRATED WITH PHOTOVOLTAIC CELLS

PRIORITY

The present patent application claims priority to and incorporates by reference the corresponding provisional patent application Ser. No. 62/331,355, titled, "Holographic Metamaterial Antenna Integrated with Photovoltaic Cells," filed on May 3, 2016.

FIELD OF THE INVENTION

Embodiments of the present invention relate to the antennas used for wireless communication; more particularly, embodiments of the present invention relate to a metamaterial or other antenna with integrated photovoltaic cells and methods for controlling the same.

BACKGROUND OF THE INVENTION

Currently antennas require separate power supplies to provide power to the antenna electronics, heater, amplifiers, and modem. While this is not inconvenient for most antennas, for portable antennas this is a disadvantage as it limits their mobility to locations where electric power has been distributed.

Solar power technology has existed for many years. Solar power is limited in that it requires directing solar cells that are used to capture the solar energy at the sun. However, this becomes difficult to use with devices such as satellite antennas, which may be pointing in a direction different than peak solar flux, to stay fixed on a satellite for their operation.

SUMMARY OF THE INVENTION

A holographic antenna integrated with photovoltaic cells and method for use of the same are described. In one embodiment, the method for using an antenna comprises receiving position data indicative of an antenna aperture of an antenna after the antenna has been placed in a position to increase capture of solar energy by one or more photovoltaic (PV) structures integrated into a surface of the antenna aperture; and in response to the position data, electronically steering an array of antenna elements of the antenna to redirect a beam toward a satellite based on the position of the antenna while maintaining the position of the antenna for increased capture of the solar energy.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE PRESENT INVENTION

Figure 1:
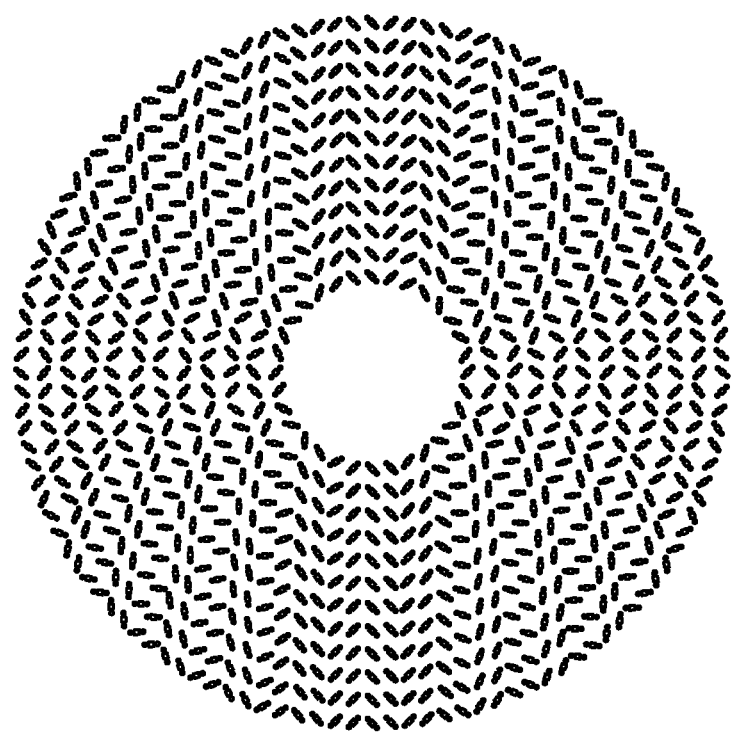
FIG. 1 illustrates an aperture having one or more arrays of antenna elements placed in concentric rings around an input feed of the cylindrically fed antenna.

Embodiments of the invention are a solar-powered antenna. In one embodiment, the antenna comprises a holographic metamaterial antenna that includes photovoltaic (PV) structures, such as, for example, PV cells (solar cells). In one embodiment, the tuning medium comprises a liquid crystal. In another embodiment, the antenna comprises PV cells with a holographic antenna that uses MEMS-based, or other non-liquid crystal-based, tuning mechanisms to produce holographic beam forming.

In one embodiment, PV cells are integrated onto an optically transparent substrate together with tunable holographic metamaterial antenna elements. In one embodiment, the PV cells are interleaved between antenna elements and the power distribution is interleaved between the circuitry to drive the antenna elements (e.g., rows and columns of drive circuitry for controlling the antenna elements).

By integrating PV cells onto the same substrate as the antenna elements, the antenna is completely stand-alone, with no separate power supply or cords. That is, the power supplies needed to power different antenna terminal components can be eliminated, making the technology truly portable and cordless. In one embodiment, such an integration also reduces and/or eliminates a battery that must accompany the device.

Embodiments of the invention have one or more of the following advantages:

Lighter weight by eliminating/reducing the size of the battery;

Easier to set up and use, because no power cables are required; and

Reduced physical volume and weight by eliminating various power supplies and integrating those features onto the antenna substrate.

Antenna Embodiments

The PV structures described herein may be used with various antennas, including flat panel antennas. Embodiments of such flat panel antennas are disclosed. The flat panel antennas include one or more arrays of antenna elements on an antenna aperture. In one embodiment, the antenna elements comprise liquid crystal cells. In another embodiment, the antenna elements comprise microelectromechanical systems (MEMS) devices. In one embodiment, the flat panel antenna is a cylindrically fed antenna that includes matrix drive circuitry to uniquely address and drive each of the antenna elements that are not placed in rows and columns. Note that the feed need not be circular. In one embodiment, the elements are placed in rings.

In one embodiment, the antenna aperture having the one or more arrays of antenna elements is comprised of multiple segments coupled together. When coupled together, the combination of the segments form closed concentric rings of antenna elements. In one embodiment, the concentric rings are concentric with respect to the antenna feed.

In one embodiment, the flat panel antenna is part of an antenna system used for satellite earth stations. In one embodiment, the antenna system is a component or subsystem of a satellite earth station (ES) operating on a mobile platform (e.g., aeronautical, maritime, land, etc.) that operates using either Ka-band frequencies or Ku-band frequencies for civil commercial satellite communications. Note that embodiments of the antenna system also can be used in earth stations that are not on mobile platforms (e.g., fixed or transportable earth stations).

In one embodiment, the antenna system uses surface scattering technology to form and steer transmit and receive beams through separate antennas. In one embodiment, the antenna systems are analog systems, in contrast to antenna systems that employ digital signal processing to electrically form and steer beams (such as phased array antennas).

In one embodiment, the antenna system is comprised of three functional subsystems: (1) a wave guiding structure consisting of a cylindrical wave feed architecture; (2) an array of wave scattering antenna elements; and (3) a control structure to command formation of an adjustable radiation field (beam) from the scattering antenna elements using holographic principles.

FIG. 1 illustrates an aperture having one or more arrays of antenna elements placed in concentric rings around an input feed of the cylindrically fed antenna. Note that the RF resonators described herein may be used in antennas that do not include a cylindrical feed.

In one embodiment, the antenna includes a coaxial feed that is used to provide a cylindrical wave feed. In one embodiment, the cylindrical wave feed architecture feeds the antenna from a central point with an excitation that spreads outward in a cylindrical manner from the feed point. That is, a cylindrically fed antenna creates an outward travelling concentric feed wave. Even so, the shape of the cylindrical feed antenna around the cylindrical feed can be circular, square or any shape. In another embodiment, a cylindrically fed antenna creates an inward travelling feed wave. In such a case, the feed wave most naturally comes from a circular structure.

In one embodiment, the antenna includes one or more arrays of antenna elements and the antenna elements comprise a group of patch antennas. This group of patch antennas comprises an array of scattering elements. In one embodiment, each scattering element in the antenna system is part of a unit cell that consists of a lower conductor, a dielectric substrate and an upper conductor that embeds a complementary electric inductive-capacitive resonator ("complementary electric LC" or "CELC") that is etched in or deposited onto the upper conductor.

In one embodiment, a liquid crystal (LC) is disposed in the gap around the scattering element. In one embodiment, liquid crystal is encapsulated in each unit cell and separates the lower conductor associated with a slot from an upper conductor associated with its patch. Liquid crystal has a permittivity that is a function of the orientation of the molecules comprising the liquid crystal, and the orientation of the molecules (and thus the permittivity) can be controlled by adjusting the bias voltage across the liquid crystal. Using this property, in one embodiment, the liquid crystal integrates an on/off switch for the transmission of energy from the guided wave to the CELC. When switched on, the CELC emits an electromagnetic wave like an electrically small dipole antenna. Note that the teachings herein are not limited to having a liquid crystal that operates in a binary fashion with respect to energy transmission.

In one embodiment, the feed geometry of this antenna system allows the antenna elements to be positioned at forty-five degree (45°) angles to the vector of the wave in the wave feed. Note that other positions may be used (e.g., at 40° angles). This position of the elements enables control of the free space wave received by or transmitted/radiated from the elements. In one embodiment, the antenna elements are arranged with an inter-element spacing that is less than a free-space wavelength of the operating frequency of the antenna. In one embodiment, if there are four scattering elements per wavelength, the elements in a 30 GHz transmit antenna will be approximately 2.5 mm (i.e., ¼th the 10 mm free-space wavelength of 30 GHz).

In one embodiment, the two sets of elements are perpendicular to each other and simultaneously have equal amplitude excitation if controlled to the same tuning state. Rotating them +/−45 degrees relative to the feed wave excitation achieves both desired features at once. Rotating one set 0 degrees and the other 90 degrees would achieve the perpendicular goal, but not the equal amplitude excitation goal. Note that 0 and 90 degrees may be used to achieve isolation when feeding the array of antenna elements in a single structure from two sides.

The amount of radiated power from each unit cell is controlled by applying a voltage to the patch (potential across the LC channel) using a controller. Traces to each patch are used to provide the voltage to the patch antenna. The voltage is used to tune or detune the capacitance and thus the resonance frequency of individual elements to effectuate beam forming. The voltage required is dependent on the liquid crystal mixture being used. The voltage tuning characteristic of liquid crystal mixtures is mainly described by a threshold voltage at which the liquid crystal starts to be affected by the voltage and the saturation voltage, above which an increase of the voltage does not cause major tuning in liquid crystal. These two characteristic parameters can change for different liquid crystal mixtures.

Figure 2:
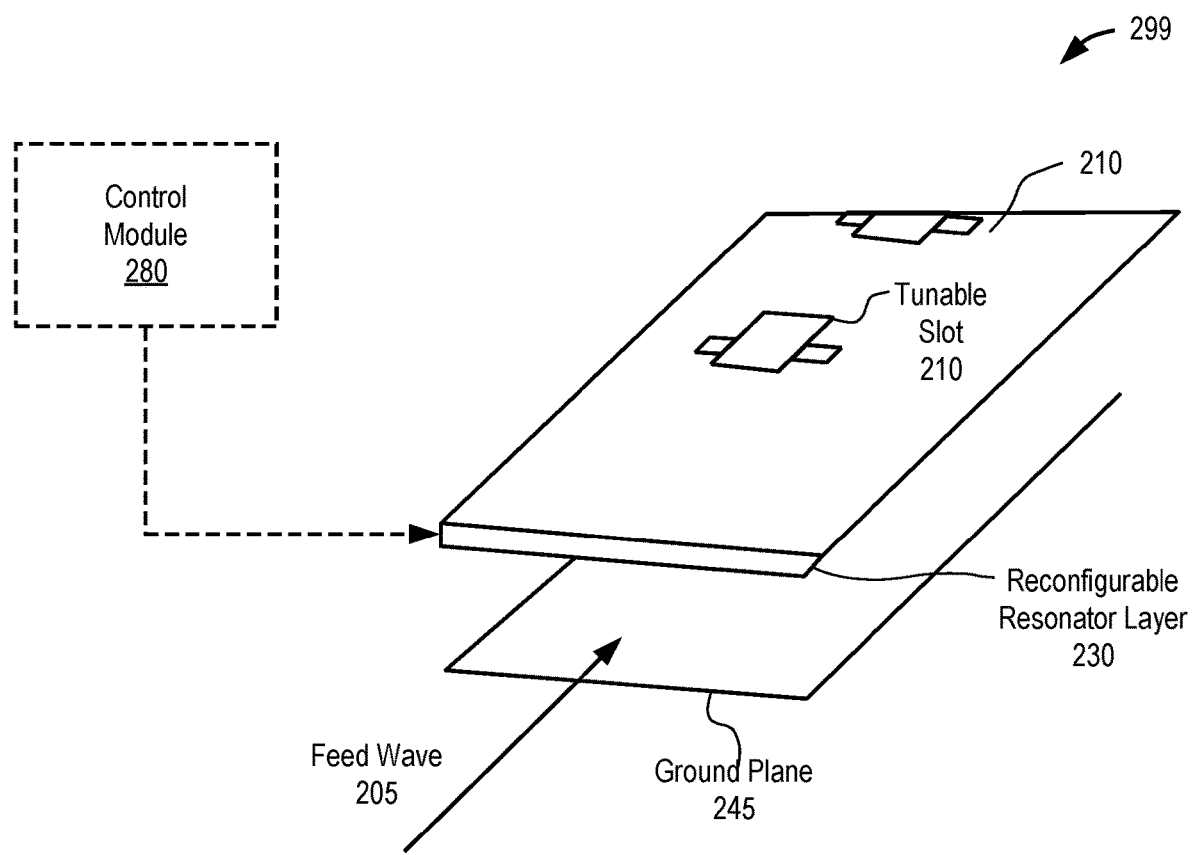
FIG. 2 illustrates a perspective view of one row of antenna elements that includes a ground plane and a reconfigurable resonator layer.

FIG. 2 illustrates a perspective view of one row of antenna elements that includes a ground plane and a reconfigurable resonator layer. Reconfigurable resonator layer 230 includes an array of tunable slots 210. The array of tunable slots 210 can be configured to point the antenna in a desired direction. Each of the tunable slots can be tuned/adjusted by varying a voltage across a space between the iris and patch associated with each slot.

Control module 280 is coupled to reconfigurable resonator layer 230 to modulate the array of tunable slots 210 by varying the voltage across gap between the iris and patch associated with each slot in FIG. 2. Control module 280 may include a Field Programmable Gate Array ("FPGA"), a microprocessor, a controller, System-on-a-Chip (SoC), or other processing logic. In one embodiment, control module 280 includes logic circuitry (e.g., multiplexer) to drive the array of tunable slots 210. In one embodiment, control module 280 receives data that includes specifications for a holographic diffraction pattern to be driven onto the array of tunable slots 210. The holographic diffraction patterns may be generated in response to a spatial relationship between the antenna and a satellite so that the holographic diffraction pattern steers the downlink beams (and uplink beam if the antenna system performs transmit) in the appropriate direction for communication. Although not drawn in each figure, a control module similar to control module 280 may drive each array of tunable slots described in the figures of the disclosure.

Radio Frequency ("RF") holography is also possible using analogous techniques where a desired RF beam can be generated when an RF reference beam encounters an RF holographic diffraction pattern. In the case of satellite communications, the reference beam is in the form of a feed wave, such as feed wave 205 (approximately 20 GHz in some embodiments). To transform a feed wave into a radiated beam (either for transmitting or receiving purposes), an interference pattern is calculated between the desired RF beam (the object beam) and the feed wave (the reference beam). The interference pattern is driven onto the array of tunable slots 210 as a diffraction pattern so that the feed wave is "steered" into the desired RF beam (having the desired shape and direction). In other words, the feed wave encountering the holographic diffraction pattern "reconstructs" the object beam, which is formed according to design requirements of the communication system. The holographic diffraction pattern contains the excitation of each element and is calculated by $w_{hologram} = w_{in} * w_{out}$, with $w_{in}$ as the wave equation in the waveguide and $w_{out}$ the wave equation on the outgoing wave.

Figure 3:
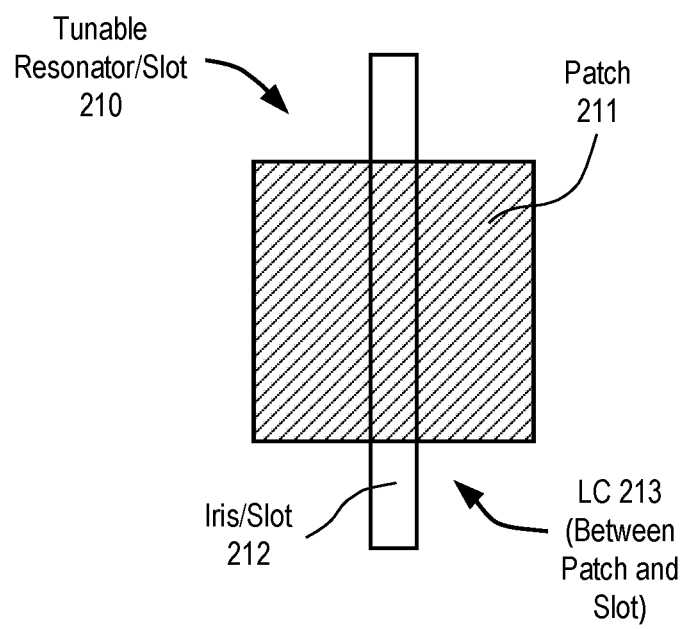
FIG. 3 illustrates one embodiment of a tunable resonator/slot.

FIG. 3 illustrates one embodiment of a tunable resonator/slot 210. Tunable slot 201 includes an iris/slot 212, a radiating patch 1211, and liquid crystal 213 disposed between iris 212 and patch 211. In one embodiment, radiating patch 211 is co-located with iris 212.

In one embodiment, tunable slots in a row are spaced from each other by $\lambda/5$. Other spacings may be used. In one embodiment, each tunable slot in a row is spaced from the closest tunable slot in an adjacent row by $\lambda/2$, and, thus, commonly oriented tunable slots in different rows are spaced by $\lambda/4$, though other spacings are possible (e.g., $\lambda/5$, $\lambda/6.3$). In another embodiment, each tunable slot in a row is spaced from the closest tunable slot in an adjacent row by $\lambda/3$.

Figure 4:
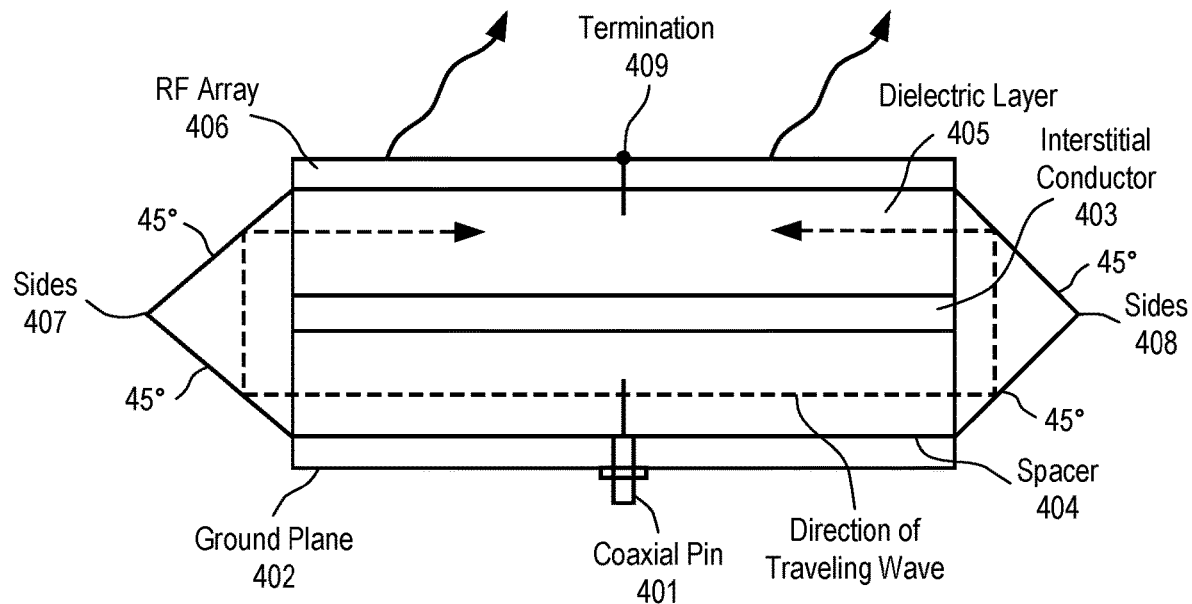
FIG. 4 illustrates a side view of one embodiment of a cylindrically fed antenna structure.

FIG. 4 illustrates a side view of one embodiment of a cylindrically fed antenna structure. The antenna produces an inwardly travelling wave using a double layer feed structure (i.e., two layers of a feed structure). In one embodiment, the antenna includes a circular outer shape, though this is not required. That is, non-circular inward travelling structures can be used. In one embodiment, the antenna structure in FIG. 4 includes a coaxial feed.

Referring to FIG. 4, a coaxial pin 401 is used to excite the field on the lower level of the antenna. In one embodiment, coaxial pin 401 is a 5052 coax pin that is readily available. Coaxial pin 401 is coupled (e.g., bolted) to the bottom of the antenna structure, which is conducting ground plane 402.

Separate from conducting ground plane 402 is interstitial conductor 403, which is an internal conductor. In one embodiment, conducting ground plane 402 and interstitial conductor 403 are parallel to each other. In one embodiment, the distance between ground plane 402 and interstitial conductor 403 is 0.1-0.15". In another embodiment, this distance may be $\lambda/2$, where $\lambda$ is the wavelength of the traveling wave at the frequency of operation.

Ground plane 402 is separated from interstitial conductor 403 via a spacer 404. In one embodiment, spacer 404 is a foam or air-like spacer. In one embodiment, spacer 404 comprises a plastic spacer.

On top of interstitial conductor 403 is dielectric layer 405. In one embodiment, dielectric layer 405 is plastic. The purpose of dielectric layer 405 is to slow the travelling wave relative to free space velocity. In one embodiment, dielectric layer 405 slows the travelling wave by 30% relative to free space. In one embodiment, the range of indices of refraction that are suitable for beam forming are 1.2-1.8, where free space has, by definition, an index of refraction equal to 1. Other dielectric spacer materials, such as, for example, plastic, may be used to achieve this effect. Note that materials other than plastic may be used as long as they achieve the desired wave slowing effect. Alternatively, a material with distributed structures may be used as dielectric 405, such as periodic sub-wavelength metallic structures that can be machined or lithographically defined, for example.

An RF-array 406 that includes tunable slots with patch/iris pairs is on top of dielectric 405. In one embodiment, the distance between interstitial conductor 403 and RF-array 406 is 0.1-0.15". In another embodiment, this distance may be $\lambda_{eff}/2$, where $\lambda_{eff}$ is the effective wavelength in the medium at the design frequency.

The antenna includes sides 407 and 408. Sides 407 and 408 are angled to cause a travelling wave feed from coax pin 401 to be propagated from the area below interstitial conductor 403 (the spacer layer) to the area above interstitial conductor 403 (the dielectric layer) via reflection. In one embodiment, the angle of sides 407 and 408 are at 45° angles. In an alternative embodiment, sides 407 and 408 could be replaced with a continuous radius to achieve the reflection. While FIG. 4 shows angled sides that have angle of 45 degrees, other angles that accomplish signal transmission from lower level feed to upper level feed may be used. That is, given that the effective wavelength in the lower feed will generally be different than in the upper feed, some deviation from the ideal 45° angles could be used to aid transmission from the lower to the upper feed level. For example, in another embodiment, the 45° angles are replaced with a single step. The steps on one end of the antenna go around the dielectric layer, interstitial the conductor, and the spacer layer. The same two steps are at the other ends of these layers. Note that in another alternative embodiment, sides 407 and 408 are replaced by multiple steps.

In operation, when a feed wave is fed in from coaxial pin 401, the wave travels outward concentrically oriented from coaxial pin 401 in the area between ground plane 402 and interstitial conductor 403. The concentrically outgoing waves are reflected by sides 407 and 408 and travel inwardly in the area between interstitial conductor 403 and RF array 406. The reflection from the edge of the circular perimeter causes the wave to remain in phase (i.e., it is an in-phase reflection). The travelling wave is slowed by dielectric layer 405. At this point, the travelling wave starts interacting and exciting with elements in RF array 406 to obtain the desired scattering.

To terminate the travelling wave, a termination 409 is included in the antenna at the geometric center of the antenna. In one embodiment, termination 409 comprises a pin termination (e.g., a 50Ω pin). In another embodiment, termination 409 comprises an RF absorber that terminates unused energy to prevent reflections of that unused energy back through the feed structure of the antenna. These could be used at the top of RF array 406.

Figure 5:
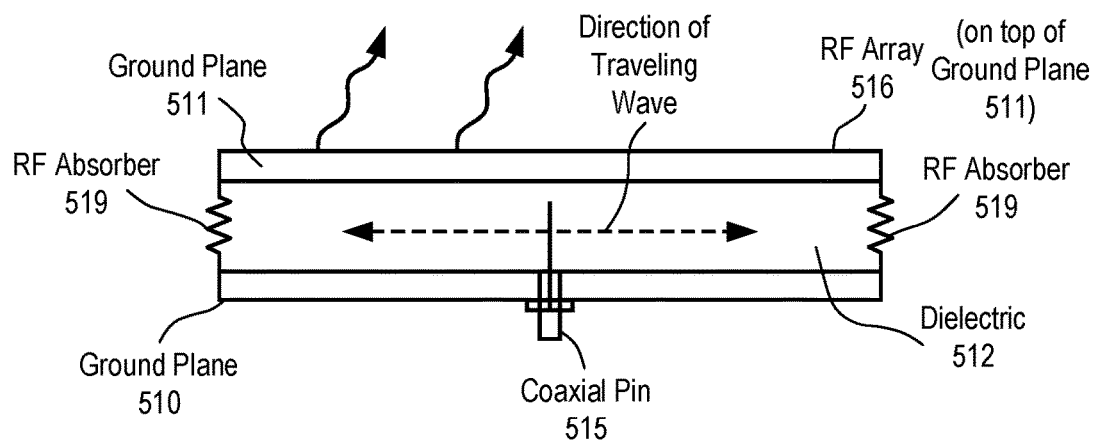
FIG. 5 illustrates another embodiment of the antenna system with an outgoing wave.

FIG. 5 illustrates another embodiment of the antenna system with an outgoing wave. Referring to FIG. 5, two ground planes 510 and 511 are substantially parallel to each other with a dielectric layer 512 (e.g., a plastic layer, etc.) in between ground planes. RF absorbers 519 (e.g., resistors) couple the two ground planes 510 and 511 together. A coaxial pin 515 (e.g., 50Ω) feeds the antenna. An RF array 516 is on top of dielectric layer 512 and ground plane 511.

In operation, a feed wave is fed through coaxial pin 515 and travels concentrically outward and interacts with the elements of RF array 516.

Array of Wave Scattering Elements

RF array 406 of FIG. 4 and RF array 516 of FIG. 5 include a wave scattering subsystem that includes a group of patch antennas (i.e., scatterers) that act as radiators. This group of patch antennas comprises an array of scattering elements. Each patch antenna comprises a patch and iris that form an RF resonator. The following discloses multiple embodiments of MEMS-based RF resonators. In one embodiment, each RF resonator has an RF radiating element with and/or containing a microelectromechanical systems (MEMS) device. In another embodiment, each RF resonator has an RF radiating element with and/or containing a liquid crystal.

In one embodiment, each scattering element in the antenna system is part of a unit cell that consists of a lower conductor, a dielectric substrate and an upper conductor that embeds a complementary electric inductive-capacitive resonator ("complementary electric LC" or "CELC") that is etched in or deposited onto the upper conductor. As discussed above, the liquid crystal acts as an on/off switch for the transmission of energy from the guided wave to the CELC. When switched on, the CELC emits an electromagnetic wave like an electrically small dipole antenna. Controlling the thickness of the LC increases the beam switching speed. A fifty percent (50%) reduction in the gap between the lower and the upper conductor (the thickness of the liquid crystal) results in a fourfold increase in speed. In another embodiment, the thickness of the liquid crystal results in a beam switching speed of approximately fourteen milliseconds (14 ms). In one embodiment, the LC is doped in a manner well-known in the art to improve responsiveness so that a seven millisecond (7 ms) requirement can be met.

The CELC element is responsive to a magnetic field that is applied parallel to the plane of the CELC element and perpendicular to the CELC gap complement. When a voltage is applied to the liquid crystal in the metamaterial scattering unit cell, the magnetic field component of the guided wave induces a magnetic excitation of the CELC, which, in turn, produces an electromagnetic wave in the same frequency as the guided wave.

The phase of the electromagnetic wave generated by a single CELC can be selected by the position of the CELC on the vector of the guided wave. Each cell generates a wave in phase with the guided wave parallel to the CELC. Because the CELCs are smaller than the wave length, the output wave has the same phase as the phase of the guided wave as it passes beneath the CELC.

In one embodiment, the CELCs are implemented with patch antennas that include a patch co-located over a slot with liquid crystal between the two. In this respect, the metamaterial antenna acts like a slotted (scattering) wave guide. With a slotted wave guide, the phase of the output wave depends on the location of the slot in relation to the guided wave.

Figure 6:
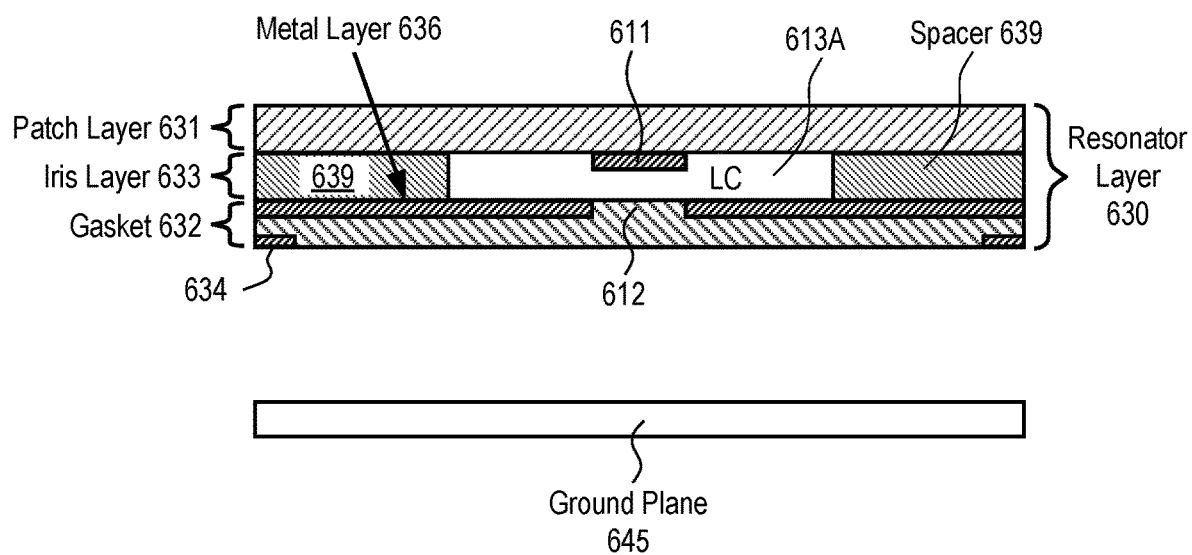
FIG. 6 illustrates a cross section view of one embodiment of a physical antenna aperture.

FIG. 6 illustrates a cross section view of one embodiment of a physical antenna aperture. The antenna aperture includes ground plane 645, and a metal layer 636 within iris layer 633, which is included in reconfigurable resonator layer 630. In one embodiment, the antenna aperture of FIG. 6 includes a plurality of tunable resonator/slots 210 of FIG. 3. Iris/slot 612 is defined by openings in metal layer 636. A feed wave, such as feed wave 205 of FIG. 2, may have a microwave frequency compatible with satellite communication channels. The feed wave propagates between ground plane 645 and resonator layer 630.

Reconfigurable resonator layer 630 also includes gasket layer 632 and patch layer 631. Gasket layer 632 is disposed below patch layer 631 and iris layer 633. Note that in one embodiment, a spacer could replace gasket layer 632. In one embodiment, iris layer 633 is a printed circuit board ("PCB") that includes a copper layer as metal layer 636. In one embodiment, iris layer 633 is glass. Iris layer 633 may be other types of substrates.

Openings may be etched in the copper layer to form slots 612. In one embodiment, iris layer 633 is conductively coupled by a conductive bonding layer to another structure (e.g., a waveguide) in FIG. 6. Note that in an embodiment the iris layer is not conductively coupled by a conductive bonding layer and is instead interfaced with a non-conducting bonding layer.

Patch layer 631 may also be a PCB that includes metal as radiating patches 611. In one embodiment, gasket layer 632 includes spacers 639 that provide a mechanical standoff to define the dimension between metal layer 636 and patch 611. In one embodiment, the spacers are 75 microns, but other sizes may be used (e.g., 3-200 mm). As mentioned above, in one embodiment, the antenna aperture of FIG. 1 includes multiple tunable resonator/slots, such as tunable resonator/slot 210 includes patch 211, liquid crystal 213, and iris 212 of FIG. 3. The chamber for liquid crystal 613A is defined by spacers 639, iris layer 633 and metal layer 636. When the chamber is filled with liquid crystal, patch layer 631 can be laminated onto spacers 639 to seal liquid crystal within resonator layer 630.

A voltage between patch layer 631 and iris layer 633 can be modulated to tune the liquid crystal in the gap between the patch and the slots (e.g., tunable resonator/slot 210). Adjusting the voltage across liquid crystal 613A varies the capacitance of a slot (e.g., tunable resonator/slot 210). Accordingly, the reactance of a slot (e.g., tunable resonator/slot 210) can be the inductance and capacitance of slot 610, respectively. The resonant frequency of slot 610 affects the energy radiated from feed wave propagating through the waveguide. As an example, if feed wave is 20 GHz, the resonant frequency of a slot may be adjusted (by varying the capacitance) to 17 GHz so that the slot couples substantially no energy from feed wave. Or, the resonant frequency of a slot may be adjusted to 20 GHz so that the slot couples energy from feed wave and radiates that energy into free space. Although the examples given are binary (fully radiating or not radiating at all), full gray scale control of the reactance, and therefore the resonant frequency of slot is possible with voltage variance over a multi-valued range. Hence, the energy radiated from each slot can be finely controlled so that detailed holographic diffraction patterns can be formed by the array of tunable slots.

Embodiments use reconfigurable metamaterial technology to generate a beam using, such as described in U.S. Patent Publication No. 2015/0236412, entitled "Dynamic Polarization and Coupling Control from a Steerable Cylindrically Fed Holographic Antenna," published Aug. 20, 2015 and U.S. Patent Publication No. 2015/0222021, entitled "Ridged Waveguide Feed Structures for Reconfigurable Antenna," published Aug. 6, 2015.

Photovoltaic Cell (Structure) Integration into the Antenna

In one embodiment, the antenna elements are tunable holographic antenna elements and the PV cells are integrated onto an optically transparent substrate together with tunable holographic antenna elements. The antenna elements may be metamaterial elements. In one embodiment, the PV cells are interspersed between antenna elements. In one embodiment, PV structures, such as cells, are integrated into a surface of an electronically scanned array of antenna elements.

Figure 7:
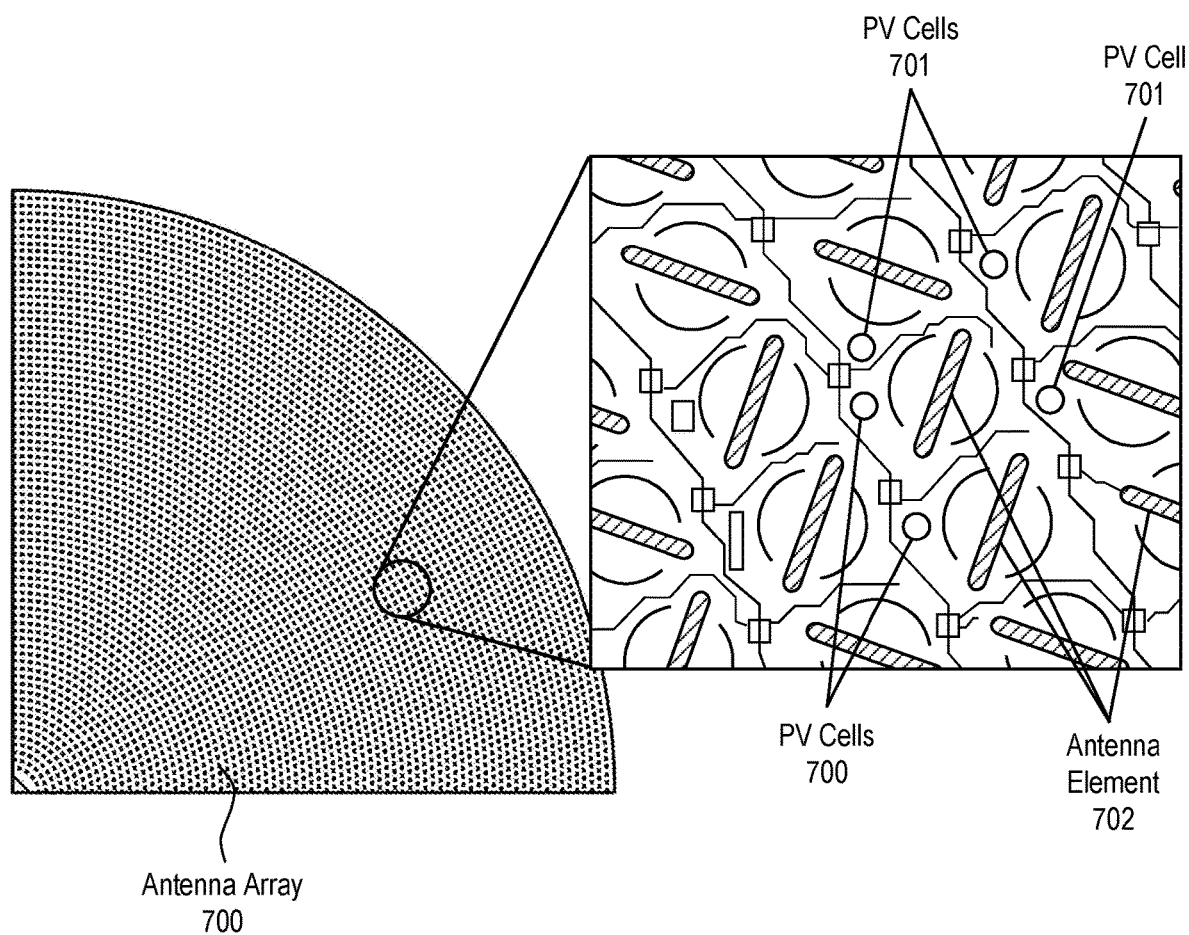
FIG. 7 illustrates an example of photovoltaic (PV) cell placement adjacent to antenna elements of an antenna.

In one embodiment, the PV cells may be interleaved between antenna elements in the active area of an array of antenna elements. FIG. 7 illustrates an example of photovoltaic (PV) cell placement adjacent to antenna elements of an antenna. Referring to FIG. 7, an antenna array having antenna elements is shown with a zoomed-in section that depicts a number of antenna elements 702. In one embodiment, antenna elements 702 include the patch/slot pairs described above. FIG. 7 also shows examples of locations of PV cells 701.

Figure 8:
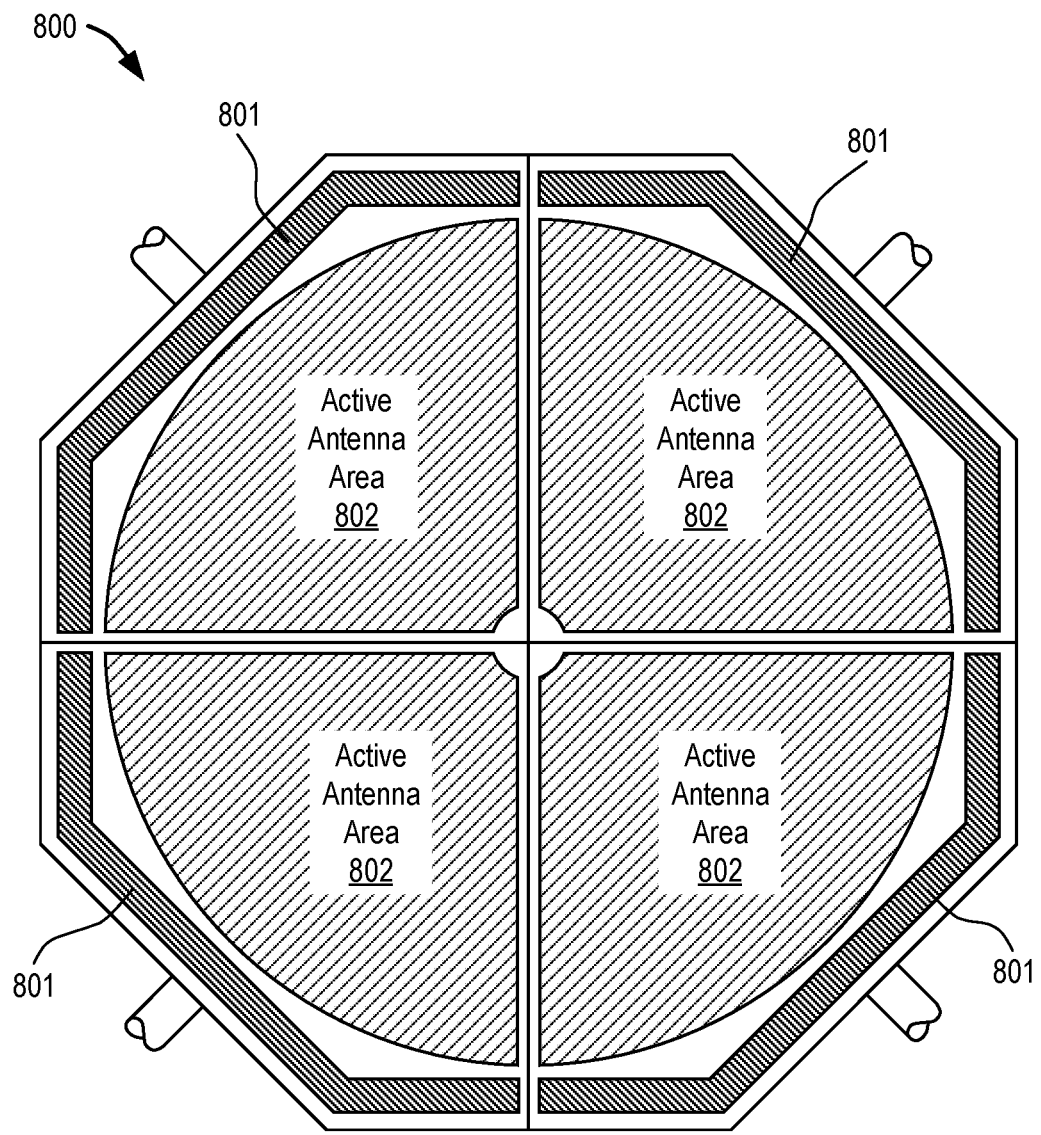
FIG. 8 illustrates another example of PV cell placement in an antenna.

In one embodiment, PV cells may be located on other parts of an antenna. FIG. 8 illustrates another example of PV cell placement in an antenna in which the PV cells are located in the periphery around the active antenna element array. The periphery may comprise the antenna frame, bezel areas, etc.

Referring to FIG. 8, antenna 800 includes four segments that are coupled together to form an antenna aperture. Each of the four segments has an active array section 802, such that when the four segments are coupled together, a single antenna array is formed by the active array sections 802. Around each of the antenna array sections 802 is the periphery of the active array. In one embodiment, PV cells 801 are located in the antenna periphery and outside the active array formed by active array sections 802. In another embodiment, PV cells are located in both the active array and the antenna periphery.

Figure 9A:
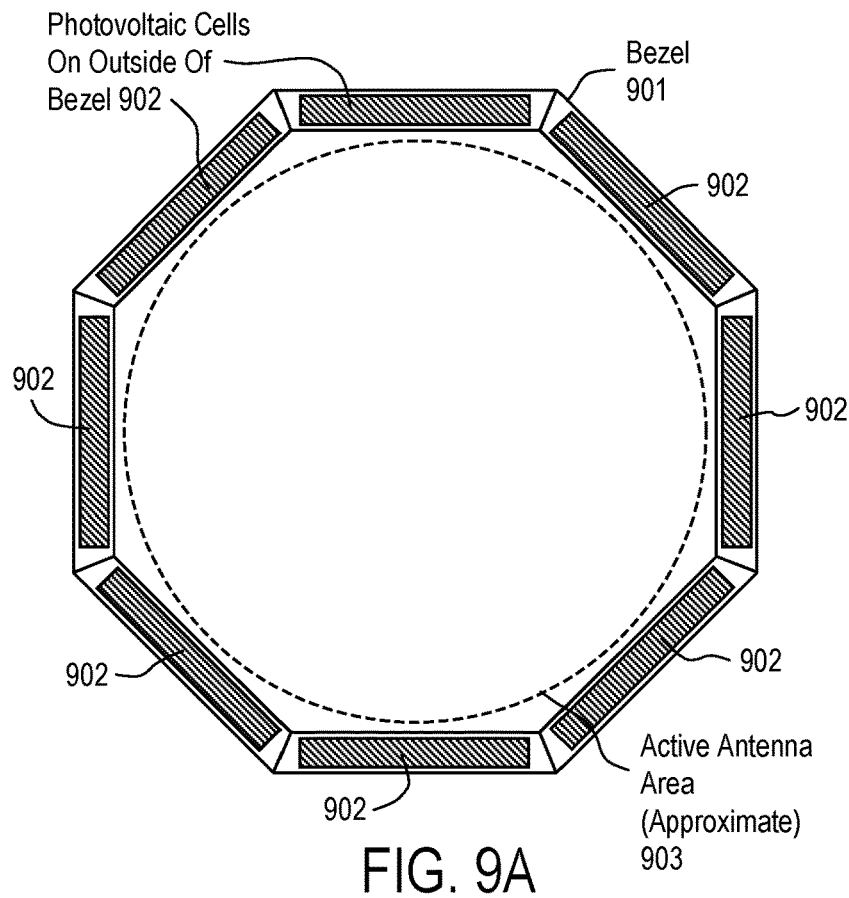
FIGS. 9A-9C illustrate yet another example of PV cell placement in an antenna.
Figure 9B:
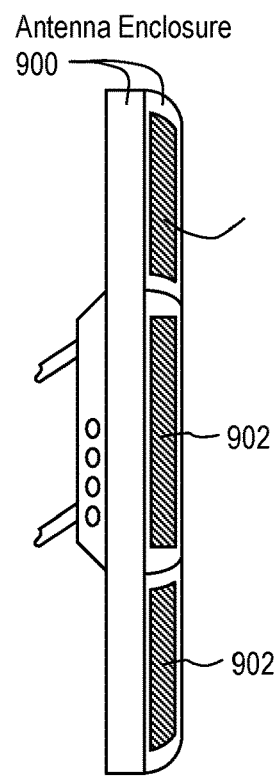
Figure 9C:
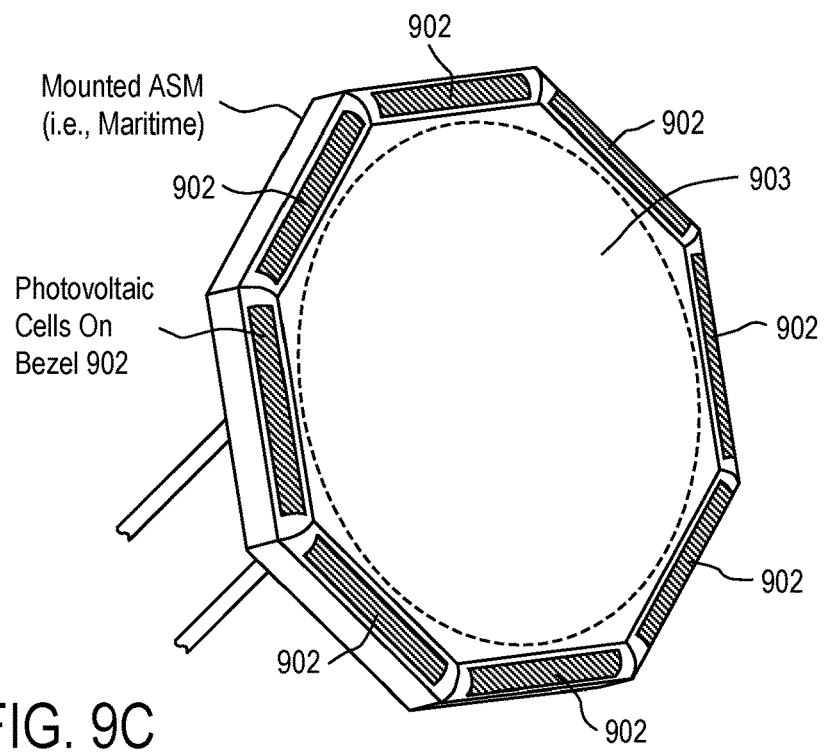

In one embodiment, the PV cells wrap around the vertical edges of the bezel (perpendicular to the main antenna). FIGS. 9A-9C illustrate another example of such PV cell placement in an antenna. Referring to FIGS. 9A-9C, PV cells 902 are located in the area of bezel 901, which is on one side of antenna enclosure 900 and are outside of the active array 903 of antenna elements. In one embodiment, because the edge is rounded, the PV cells must be flexible to bend around the edge of the antenna. In one embodiment, the PV cells are on a flexible plastic substrate. In one embodiment, the flexible plastic substrate comprises an amorphous Si PV line using thin stainless steel. The substrate may be a high molecular weight organic solid or a non-organic solid that is thinned enough to be flexible (e.g., a thin low stress glass like CORNING® GORILLA® GLASS).

In another embodiment, the PV cells are built on a rigid curved surface that is not flexible.

Note that FIGS. 8 and 9A-C only show examples of locations for PV cells on an antenna frame. Other locations are possible. Also, note that the energy storage components (e.g., rechargeable battery, capacitor, etc.) as well as the circuitry to support the collection and distribution of solar power may be incorporated into other portions of the antenna, such as, for example, in the antenna enclosure below the corners of the periphery of the antenna.

Figure 10:
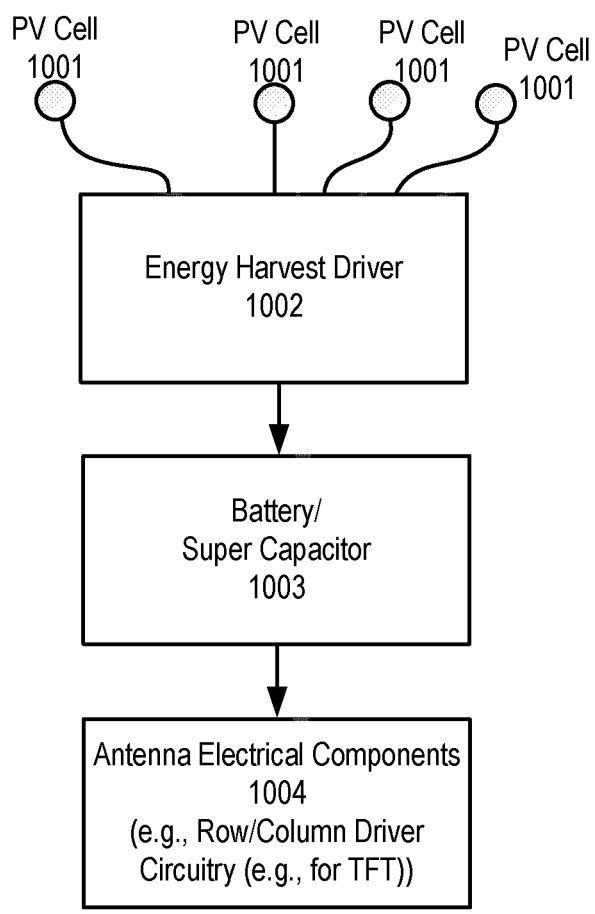
FIG. 10 illustrates one embodiment of a power distribution subsystem for an antenna that includes PV cells.

FIG. 10 illustrates one embodiment of a power distribution subsystem for an antenna that includes PV cells. Referring to FIG. 10, PV cells 1001 are coupled to an energy harvest driver 1002. Energy harvest driver 1002 sends the power to energy storage device 1003. In one embodiment, energy storage device 1003 comprises a rechargeable battery. In another embodiment, energy storage device 1003 comprises a super capacitor or fuel cell. Energy storage device 1003 provides power to parts of antenna electrical components 1004. For example, antenna electrical components 1004 may comprise the row/column driver circuitry of a matrix drive that turns on and off transistors (e.g., TFTs) when controlling which antenna elements are on or off.

Note that a variety of PV cells may be used and integrated into an antenna aperture using well-known fabrication techniques. In one embodiment, the PV cells are an amorphous silicon type that are created using such well-known fabrication techniques. In another embodiment, the PV cells are multijunction PV cells or triple junction solar cells. In this case, these PV cells may be III-V materials, rather than amorphous silicon.

In one embodiment, the PV cells are fabricated onto a substrate (e.g., glass layer) that contains (at least a portion) of the antenna elements. In one embodiment, the PV cells are fabricated onto the patch substrate. In this case, a metal layer on the patch substrate is used as a back contact for the PV cells.

Figure 11:
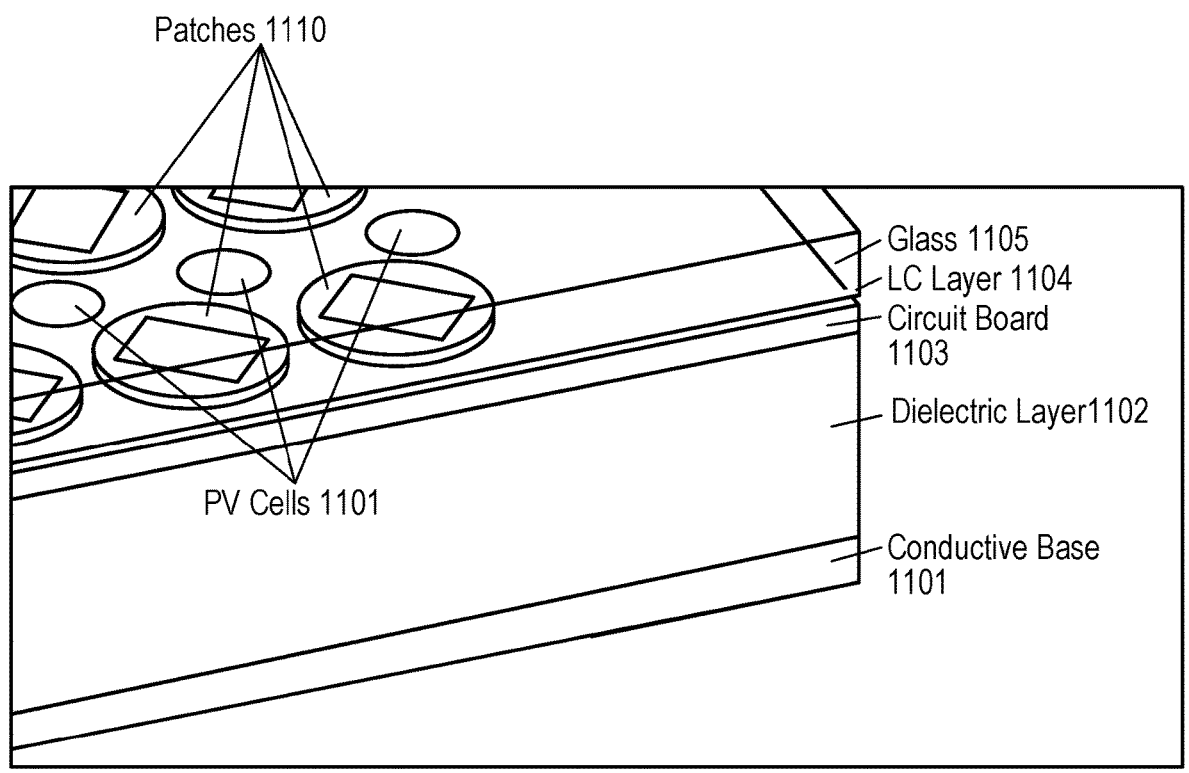
FIG. 11 is an example of PV cells being formed on the patch layer.

FIG. 11 is an example of PV cells being formed on the patch layer. In one embodiment, the patches are deposited on the glass layer (e.g., a glass typically used for LC displays (LCDs) such as, for example, Corning Eagle glass) and the PV cells (e.g., amorphous silicon, III-V materials, etc.) are integrated on top of glass layer 1105. Alternatively, both the patches and PV cells could be deposited on a circuit patch board.

Referring to FIG. 11, a portion of a cylindrically fed antenna that includes a patch glass layer that contains the patches 1110 and PV cells 1101 is shown. The antenna includes conductive base or ground layer 1101, dielectric layer 1102 (e.g., plastic), iris 1103 (e.g., a circuit board) containing slots, a liquid crystal (LC) substrate layer 1104 (or MEMS device layer), and a glass layer (substrate) 1105 containing patches 1110. In one embodiment, patches 1110 have a rectangular shape. In one embodiment, the slots and patches are positioned in rows and columns, and the orientation of patches is the same for each row or column while the orientation of the co-located slots are oriented the same with respect to each other for rows or columns, respectively. In one embodiment, a cap (e.g., a transparent radome cap usable for solar radiation) covers the top of the patch antenna stack to provide protection.

In one embodiment, the patch metal layer (not shown) that is on glass layer 1105 is also used to connect the individual PV cells together. That is, the patch metal layer is used to wire the PV cells together on the top layer on patch glass 1105. With respect to the term "top" in this context, in one embodiment, if the satellite/sun facing side of the glass is the top, the "top" electrode of the PV cell structure is ITO (transparent), the "bottom" electrode is the patch metal. In one embodiment, this bottom electrode is wired with this patch metal layer. Alternatively, the bottom electrode is wired with gate or source metal layers.

In one embodiment, PV cells of similar size are electrically connected together in series. This is done to create a desired voltage. In one embodiment, one series of connected PV cells is connected to one or more other such series in parallel. The combination of parallel and series connections is performed to obtain a desired current. In one embodiment, to wire elements in series, the positive and negative terminals of the PV cells are connected together through a via structure.

In one embodiment, in order to maximize PV cell areas, PV cells of irregular shapes are used. In one embodiment, such cells are used to fill in-between RF element keep out regions, or areas, that are kept clear of metals or lossy materials to avoid interference with RF radiating from the RF elements. In another embodiment, PV cells are placed between antenna elements in rings of antenna elements (e.g., FIG. 16A-D). In yet another embodiment, PV cells are placed in between the row/column routing. If these placements require that the PV cells be of different sizes, then some type of cell matching is used to obtain a desired voltage and current. In one embodiment, PV cells having irregular shapes yet equal in area are connected together to obtain a desired voltage.

The outputs of all the series of PV cells and the multiple series that are coupled in parallel are electrically connected to the energy storage device (e.g., battery).

Note that the PV cells of antenna segments, such as shown, for example, in FIG. 8, may be connected together in parallel. In one embodiment, to connect across the segments, the paths of the gate and common voltage lines for the antenna element drivers are used to connect the groups of PV cells along these paths, and the PV cells along these paths could be in series. For the end connections, a bus on one side of a segment collects the electrodes from the top (e.g., ITO, or the solar facing plate), and a bus on the other side of the segment collects the patch metal lines. All the PV elements along these lines would be connected in parallel by these busses. These two buses are routed out to opposite sides of the source driver and could be brought out to the antenna aperture to be connected. A structure connects these directly across the joints between segments.

In one embodiment, an ultraviolet (UV) absorber coating or cutoff filter coating is applied over the patch glass (substrate) layer 1105 to protect the LC in LC layer 1104. This is particularly advantageous when using LCs that are UV sensitive. The UV absorber coating absorbs UV, while the cutoff filter coating prevents UV light of certain frequencies from penetrating to LC layer 1104. Such coatings are well-known in the art.

In one embodiment, the coatings are placed over the glass with cut outs or holes for the PV regions. This ensures that the PV regions are able to receive solar radiation.

Figure 12:
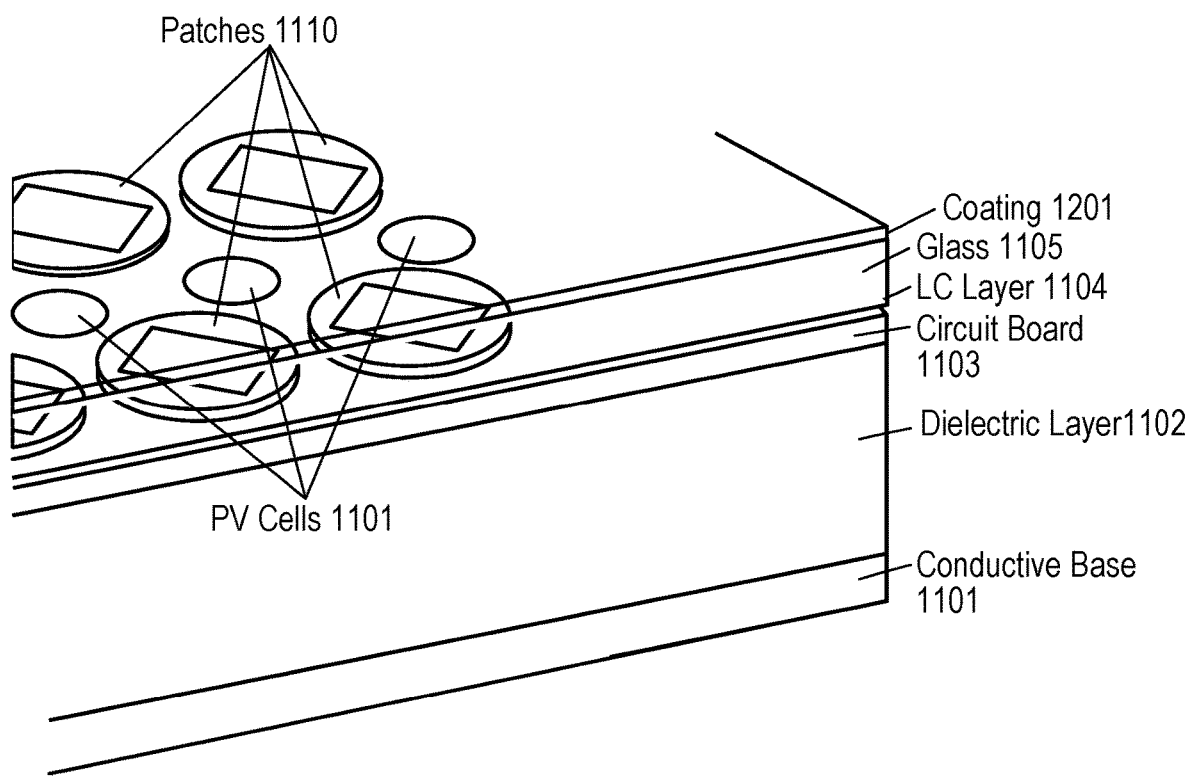
FIG. 12 illustrates an example of a coating used over PV cells on a patch substrate.

FIG. 12 illustrates an example of such a coating. Note that there are two kinds of coatings that might be desired. One of these is an antireflective coating to enhance the transmission of visible light to the PV cells. Another type of coating would be a UV absorber or reflector. Often these coatings are formed with stacks of very thin layers of dielectrics with different indices of refraction. Depending on the RF properties of the dielectrics and the thicknesses of the dielectrics, it is possible no holes would be required. Otherwise, holes would need to be opened with the size and shapes of the holes depending on the size and shape of the PV regions.

Note that in one embodiment, the antenna includes an anti-reflective top surface over the coating and/or the other layers shown in FIGS. 11 and 12. Note also that a silicone optical coating may be used to improve impact resistance/reduce glass shards on impact. More specifically, because the aperture has the TFT segment with other design elements stacked on top of it and these substrates are transparent to the solar radiation used by the PV cells, these substrates have to be coupled together. However, if these elements are on glass or other solar radiation transparent substrates, it is would be desirable to prevent losses by multiple glass/air interfaces. To facilitate this, it would be useful to optically couple these substrates together. Silicone or other substances may be used for this purpose.

Dynamic Beam Generation and Solar Energy Capture

In one embodiment, the antenna with integrated PV cells is positioned for solar energy capture and the beam (e.g., a holographic beam) is then generated with the electronically scanned antenna array of antenna elements, such as those described herein.

Figure 13A:
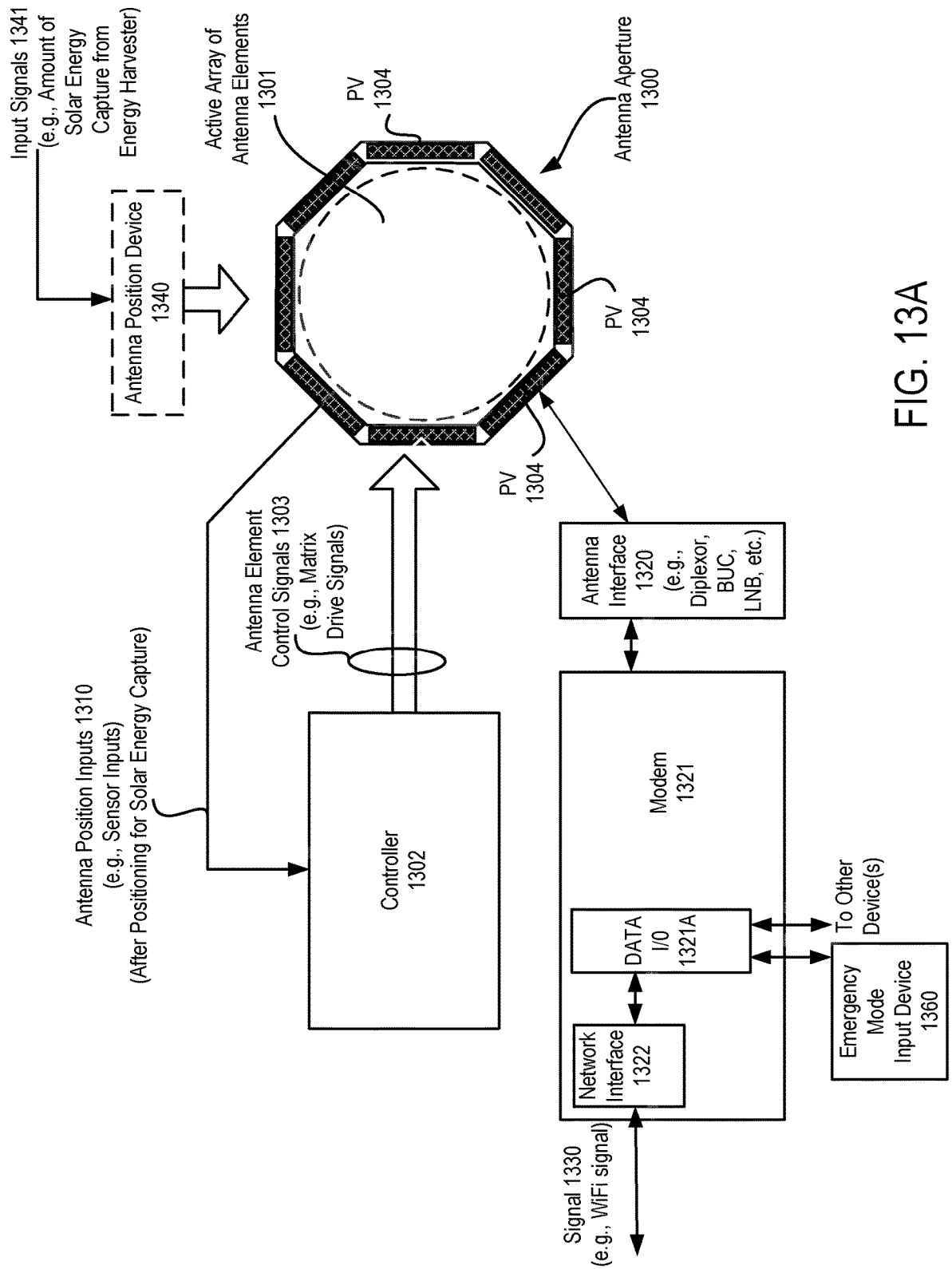
FIG. 13A illustrates data flow of one embodiment of the antenna system.

FIG. 13A illustrates data flow of one embodiment of the antenna system. Referring to FIG. 13A, an antenna aperture 1300 includes an active array of antenna elements 1301. In one embodiment, the antenna elements are metamaterial antenna elements. In another embodiment, the antenna elements are MEMS-tuned resonators. In one embodiment, the active array 1301 includes one or more PV cells. In one embodiment, the periphery of antenna aperture 1300 includes PV cells 1304. Note that PV cells 1304 include one or more PV cells connected together. The connection between PV cells and groups of PV cells is described above.

In one embodiment, controller 1302 sends antenna element control signals 1303 (e.g., matrix drive control signal, etc.) to antenna aperture 1300. These control signals turn off and on (or partially turn on) antenna elements of active array 1301 to generate a beam. In one embodiment, the beam comprises a holographic beam that is dynamically generated that is well known in the art.

Controller 1302 generates controls signals 1303 based on antenna position input signals 1310 (e.g., sensor inputs such as, for example, orientation sensor signals, etc.) that have been obtained after positioning antenna aperture 1300 for solar energy capture. That is, the antenna position input signals 1310 are used by controller 1302 to determine the orientation and/or location of the active array of antenna elements, which in turn allows controller 1302 to control antenna elements of active array 1300 in order to generate a beam in a specific direction while antenna aperture 1300 remains positioned for solar energy capture. In one embodiment, this may be performed after determining antenna aperture 1300 is positioned for maximum solar energy capture based on its orientation towards the sun or at least positioned for increased solar energy capture over a previous position of the antenna.

In one embodiment, antenna aperture 1300 is oriented for increased, and potentially maximum, solar energy capture using an antenna positioning device 1340. Such an antenna positioning device 1340 is coupled to position antenna aperture automatically through a series of motorized controls. Such motorized controls to move an object in particular positions are well known in the art. In one embodiment, antenna positioning device 1340 receives input signals 1341 that indicate the amount of solar energy being captured in different positions. Based on this information, antenna positioning device 1340 includes a module to determine where to position antenna aperture 1300 for increased and/or maximum solar energy capture. The module may be implemented in hardware, software, firmware, or a combination of the three. The determination may be made to select the position of the antenna that produced the greatest solar energy capture after positioning the antenna in a number of positions and recording the solar energy capture at each position. Alternatively, the antenna has information that specifies its orientation, geographic position and the time of day it is, as well as the location of the satellite and what it needs to close its link. Using this information, the antenna uses a value function to calculate a position that finds the best compromise between the two requirements. If the antenna is partially shaded by something, or if the antenna has access to a strong reflection (e.g., foldable mirror structure, reflection off of the ocean or lake), then it searches for a better position.

Figure 13B:
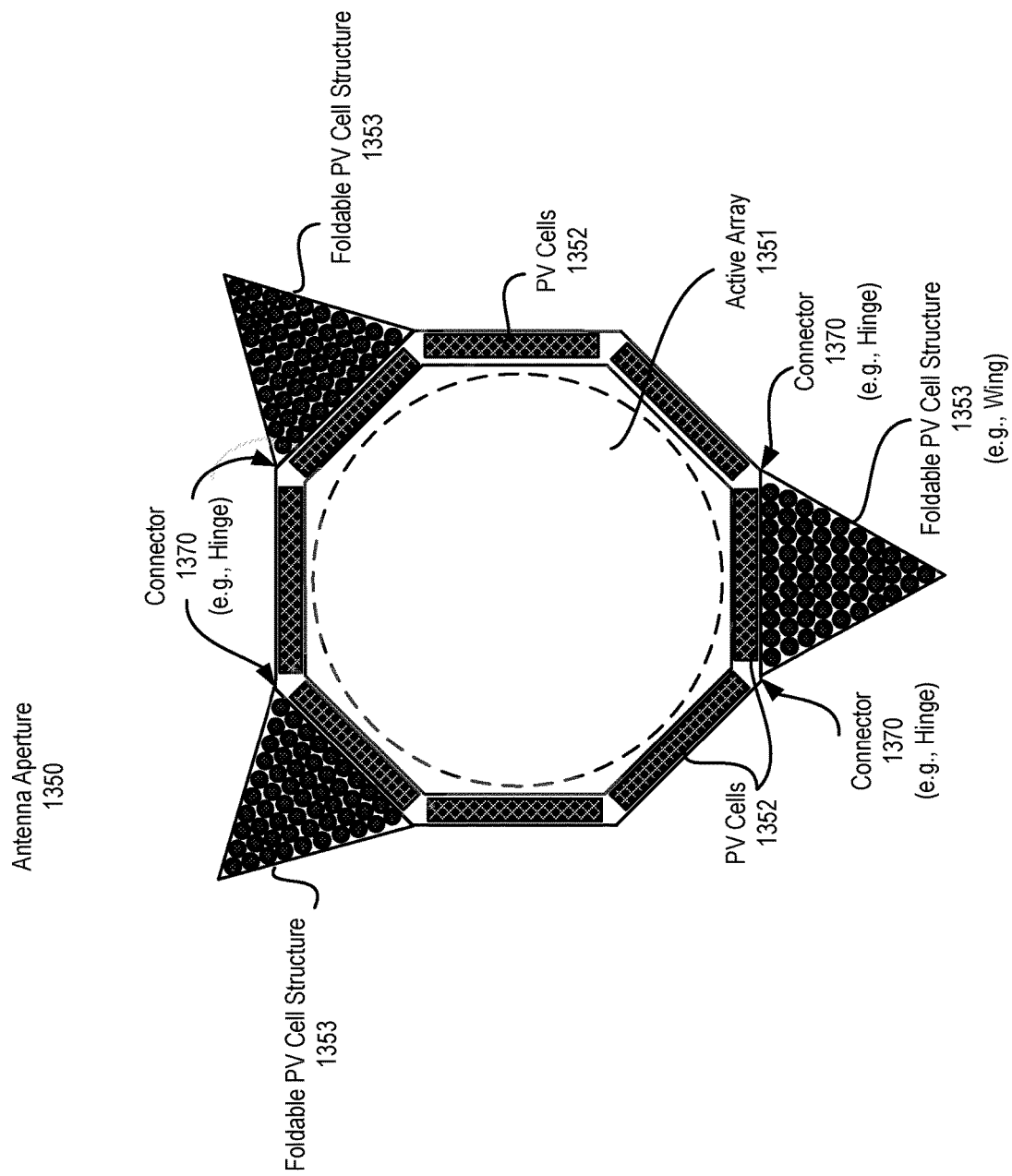
FIG. 13B illustrates another example of antenna aperture with integrated PV cells and additional solar panels.

The PV cells are not limited to being on the antenna aperture or antenna periphery. They may be part of solar panels coupled to the antenna frame. These panels may have a variety of shapes and sizes. FIG. 13B illustrates another example of antenna aperture 1300. Referring to FIG. 13B, antenna aperture 1350 includes an active array 1351 with PV cells 1352 and periphery outside of active array 1351. In another embodiment, active array 1351 includes PV cells. Antenna aperture 1350 also includes foldable PV cell structures (e.g., panels) 1353 connected to the frame of antenna aperture 1350. In one embodiment, foldable PV cell structures 1353 resemble wings that are coupled to the antenna aperture 1350 to capture additional solar energy for powering the antenna. In one embodiment, foldable PV cells 1353 are coupled to the antenna aperture 1350 in a way that allows them to move from a closed position to an open position where they are exposed to the sunlight. In one embodiment, the connection is via a hinge that allows the foldable PV cells structure to fold outwardly from a closed position to a position where the solar energy may be captured. The electronics and power delivery for the foldable PV cell structures operates in a well-known manner.

After positioning the antenna for solar energy capture (e.g., increased solar energy capture from a previous position of an antenna aperture 1300) and sending control signals to direct the beam generated by antenna aperture 1300, antenna aperture 1300 is able to locate a satellite and acquire a satellite communication link. At this point, the antenna may be used for communication. In one embodiment, modem 1321 and antenna interface 1320 are used to make use of antenna aperture 1300. In one embodiment, antenna interface 1320 includes a number of components to interface the signals between modem 1321 and antenna aperture 1300. These maybe include such components as diplexers, buck up converters (BUC), and LNBs, etc. These components operate as described in conjunction with FIGS. 19 and 20 below.

Figure 19:
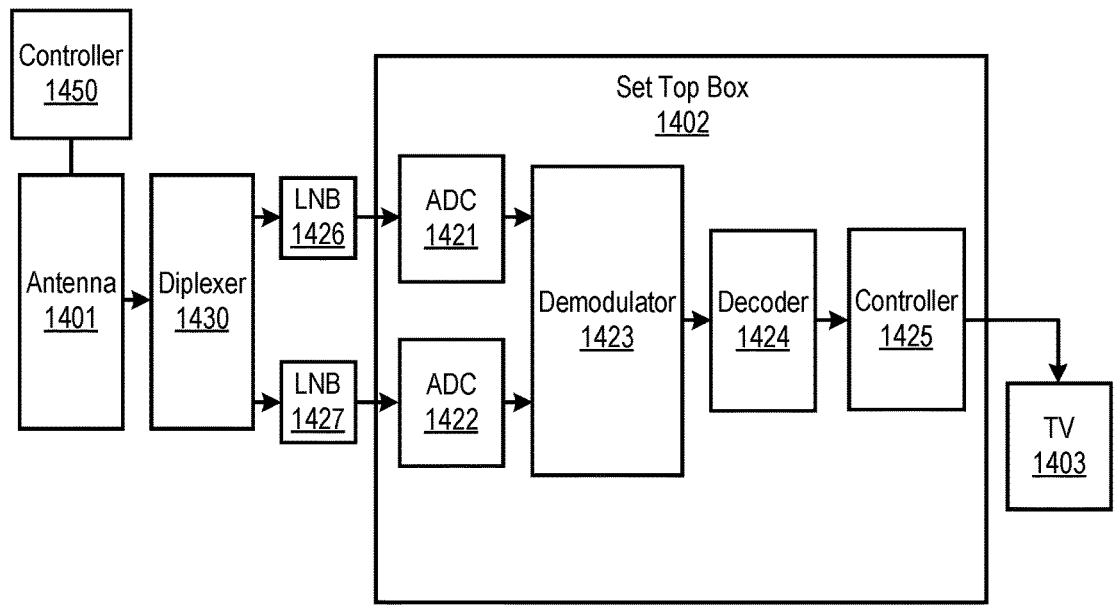
FIG. 19 is a block diagram of one embodiment of a communication system that performs dual reception simultaneously in a television system.
Figure 20:
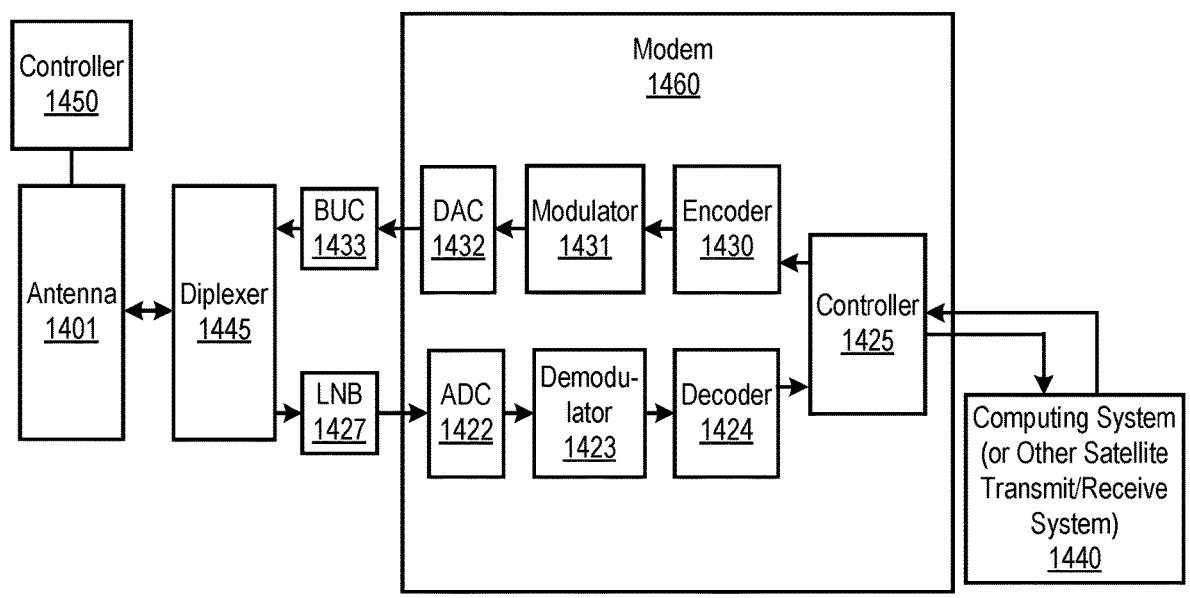
FIG. 20 is a block diagram of another embodiment of a communication system having simultaneous transmit and receive paths.

Similarly, modem 1321 includes a number of well-known components such as those shown in FIGS. 19 and 20 including a DAC, modulator, encoder, ADC, demodulator, and decoder, which are not shown in FIG. 13A to avoid obscuring the present invention. In one embodiment, modem 1321 includes a data interface 1321a that provides data input/output signals. In one embodiment, the data interface 1321 interfaces to a network interface 1322 that is able to enable communication with a network in a manner well-known in the art. In one embodiment, such a network comprises, for example, the internet. In one embodiment, after positioning antenna aperture 1300 and generating a beam, the modem 1321 via network interface 1322 is able to generate a communication signal 1330. In one embodiment, signal 1330 comprises a WiFi signal that interfaces with the internet.

In one embodiment, data interface 1321A also interfaces with an emergency mode input device 1360. The emergency mode input device 1360 enables user via the antenna system to send emergency information via the satellite network. In one embodiment, the emergency information may include location information of the antenna. This location information may include global positioning system (GPS) information. In one embodiment, other emergency codes may be sent via emergency mode input device 1360. This may include codes indicating an emergency situation such as, for example, a 911 code.

In one embodiment, the antenna is coupled to or integrated into a buoy or other floating structure that can capture energy and transmit information from water (e.g., oceans). In one embodiment, this floating antenna is part of a Tsunami warning system.

Figure 14:
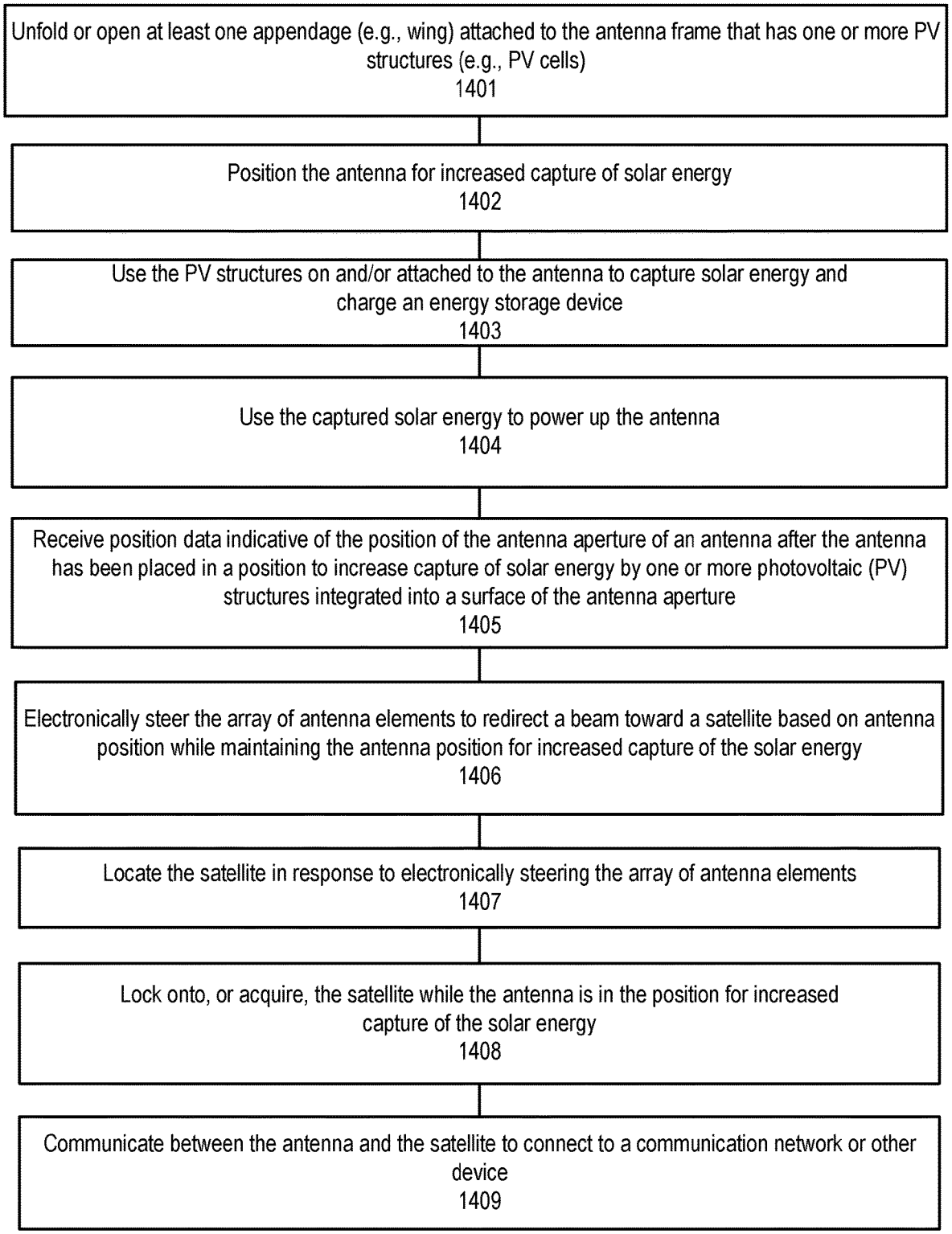
FIG. 14 is a flow diagram of one embodiment of a method for using an antenna powered, at least in part, by solar power captured by PV structures (e.g., cells) integrated onto the antenna.

FIG. 14 is a flow diagram of one embodiment of a method for using an antenna powered, at least in part, by solar power captured by PV structures (e.g., cells) integrated onto the antenna.

Referring to FIG. 14, the method begins by unfolding or opening at least one solar power structure (e.g., solar panel, or wing) attached to the antenna frame that has one or more PV structures (e.g., PV cells) (processing block 1401). This is an optional step. As discussed above in conjunction with FIG. 13B, the antenna may have extended portions or panels with additional solar capturing capabilities that can be exposed to sunlight to increase the capture of solar energy to power the operations of the antenna.

Next, the antenna is positioned for increased capture of solar energy (processing block 1402). In one embodiment, this occurs automatically. For example, in one embodiment, positioning the antenna comprises: rotating the antenna between a plurality of positions; recording amounts of solar energy capture at each of the plurality of positions; determining a direction to point the antenna automatically based on the amounts of solar energy capture; and automatically moving the antenna into the position based on the direction.

Alternatively, a user may position the antenna toward the sun or a southern direction to enable the capture of solar energy. In one embodiment, the antenna includes a mechanism to provide power feedback to the user to enable them to know the position that produces the greatest (or at least an increased amount) of solar energy capture. Such power meters are known in the art.

Once the antenna has been positioned, the PV structures on and/or attached to the antenna capture solar energy and charge an energy storage device used by and/or coupled to the antenna to provide power to the antenna (processing block 1403). In one embodiment, charging the energy storage device includes using solar energy captured by the one or more PV structures to trickle charge a battery (or other energy storage device) that supplies power to the antenna.

Using the captured solar energy, by itself or with other power being supplied to the antenna, the antenna is powered up (processing block 1404). In one embodiment, this comprises performing a warm start using the battery trickle charged with energy captured by the one or more PV structures such that the antenna is up and running sooner because some components of the antenna are already powered up with power from the trickle-charged battery.

Once powered up, position data indicative of the position of the antenna aperture of an antenna after the antenna has been placed in a position to increase capture of solar energy by one or more photovoltaic (PV) structures integrated into a surface of the antenna aperture is received by the antenna controller (processing block 1405). In response to the position data, the array of antenna elements of the antenna are electronically steered to redirect a beam toward a satellite based on the position of the antenna while maintaining the position of the antenna for increased capture of the solar energy (processing block 1406).

The antenna then locates the satellite in response to electronically steering the array of antenna elements (processing block 1407) and locks onto, or acquires, the satellite while the antenna is in the position for increased capture of the solar energy (processing block 1408).

Thereafter, communication between the antenna and the satellite is used to connect to a communication network or other device (processing block 1409). In one embodiment, the communication network comprises the internet. In one embodiment, the communication includes a WiFi signal. In one embodiment, the communication occurs only using power from a battery that is charged with captured solar energy.

In one embodiment, the antenna with integrated PV cells is used during emergency or disaster recovery by using the power captured from solar energy to power its operation. In such a case, the energy storage device (e.g., battery, super capacitor, etc.) is used to store and provide energy for running the antenna when other power sources are not available.

Figure 15:
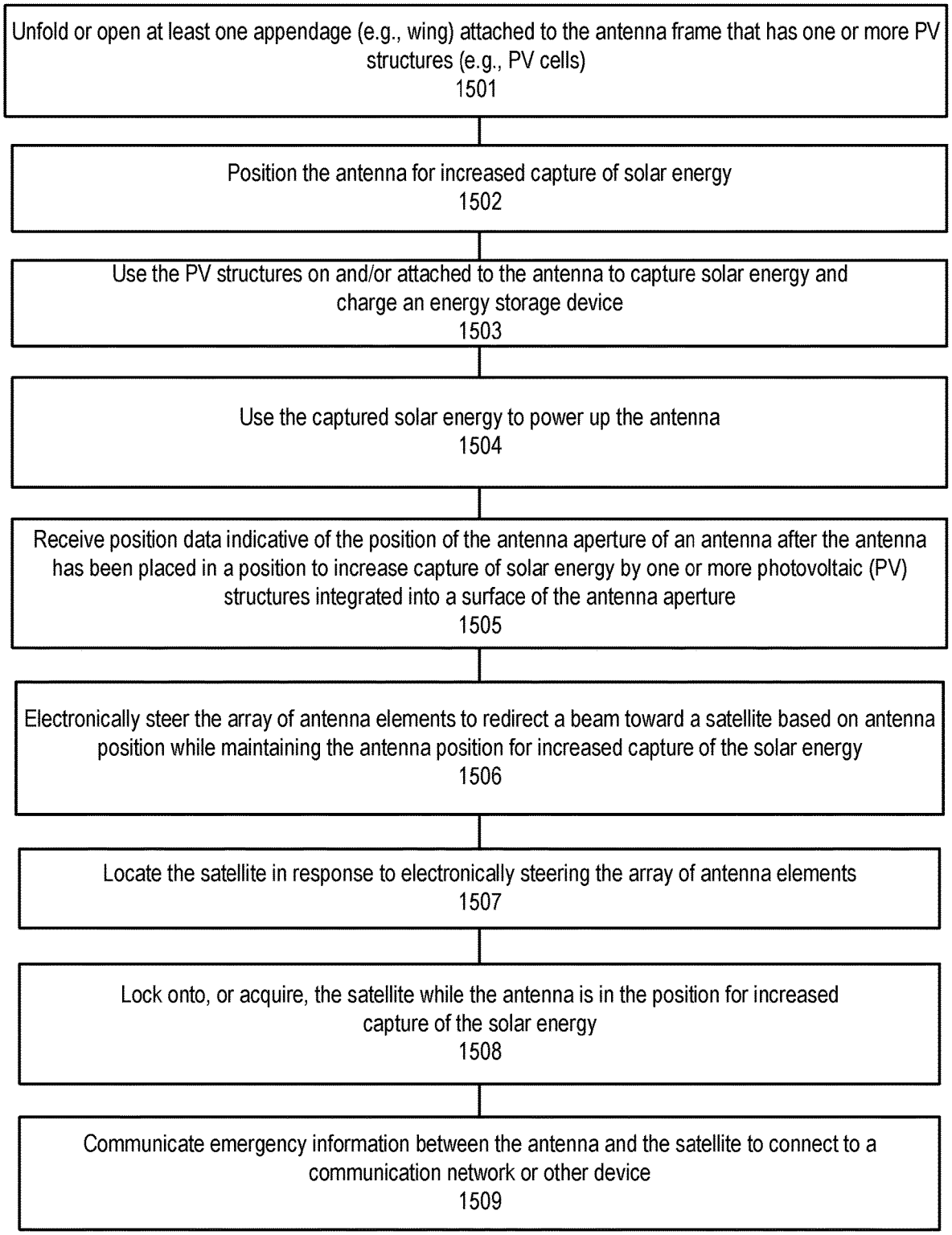
FIG. 15 is a flow diagram of a method of using a solar powered antenna.

FIG. 15 is a flow diagram of a method of using a solar powered antenna. The operations depicted in FIG. 15 are the same as those of FIG. 14 except the communication that occurs between the antenna and the satellite is made during an emergency mode.

As part of emergency mode (e.g., an emergency, disaster recovery, etc.), the communications may include different types of information. In one embodiment, the communication includes transmission of position data of the antenna. In one embodiment, the position data comprises global positioning system (GPS) data. The position data may comprise longitude and latitude information. In one embodiment, the position data may comprise data entered by a user of the antenna specifying information to enable location identification. Such information may include data that describes last known locations, landmarks, supplies and/or tools available to the antenna user, etc. Other information could be sent back, such as, but not limited to, information to a location of potable water, a location of a suitable pick up area, dangers to avoid, etc. In one embodiment, the user has an input device (e.g., keyboard, mouse, trackpad, trackball, touch-screen, portable phone, smart phone, computer system, etc.) enabling them to input information for transmission over the satellite communication link via the antenna.

Example of Antenna Control

In one embodiment, as discussed above, a matrix drive is used to apply voltage to the patches in order to drive each cell separately from all the other cells without having a separate connection for each cell (direct drive). Because of the high density of elements, the matrix drive is an efficient way to address each cell individually.

In one embodiment, the control structure for the antenna system has 2 main components: the antenna array controller, which includes drive electronics for the antenna system, is below the wave scattering structure, while the matrix drive switching array is interspersed throughout the radiating RF array in such a way as to not interfere with the radiation. In one embodiment, the drive electronics for the antenna system comprise commercial off-the shelf LCD controls used in commercial television appliances that adjust the bias voltage for each scattering element by adjusting the amplitude or duty cycle of an AC bias signal to that element.

In one embodiment, the antenna array controller also contains a microprocessor executing the software. The control structure may also incorporate sensors (e.g., a GPS receiver, a three-axis compass, a 3-axis accelerometer, 3-axis gyro, 3-axis magnetometer, etc.) to provide location and orientation information to the processor. The location and orientation information may be provided to the processor by other systems in the earth station and/or may not be part of the antenna system.

More specifically, the antenna array controller controls which elements are turned off and those elements turned on and at which phase and amplitude level at the frequency of operation. The elements are selectively detuned for frequency operation by voltage application.

For transmission, a controller supplies an array of voltage signals to the RF patches to create a modulation, or control pattern. The control pattern causes the elements to be turned to different states. In one embodiment, multistate control is used in which various elements are turned on and off to varying levels, further approximating a sinusoidal control pattern, as opposed to a square wave (i.e., a sinusoid gray shade modulation pattern). In one embodiment, some elements radiate more strongly than others, rather than some elements radiate and some do not. Variable radiation is achieved by applying specific voltage levels, which adjusts the liquid crystal permittivity to varying amounts, thereby detuning elements variably and causing some elements to radiate more than others. When the tuning element is a MEMS device, variable radiation is achieved by applying specific voltage levels to MEMS elements, which may adjust a membrane in the MEMS element to change its capacitance.

The generation of a focused beam by the metamaterial array of elements can be explained by the phenomenon of constructive and destructive interference. Individual electromagnetic waves sum up (constructive interference) if they have the same phase when they meet in free space and waves cancel each other (destructive interference) if they are in opposite phase when they meet in free space. If the slots in a slotted antenna are positioned so that each successive slot is positioned at a different distance from the excitation point of the guided wave, the scattered wave from that element will have a different phase than the scattered wave of the previous slot. If the slots are spaced one quarter of a guided wavelength apart, each slot will scatter a wave with a one fourth phase delay from the previous slot.

Using the array, the number of patterns of constructive and destructive interference that can be produced can be increased so that beams can be pointed theoretically in any direction plus or minus ninety degrees (90°) from the bore sight of the antenna array, using the principles of holography. Thus, by controlling which metamaterial unit cells are turned on or off (i.e., by changing the pattern of which cells are turned on and which cells are turned off), a different pattern of constructive and destructive interference can be produced, and the antenna can change the direction of the main beam. The time required to turn the unit cells on and off dictates the speed at which the beam can be switched from one location to another location.

In one embodiment, the antenna system produces one steerable beam for the uplink antenna and one steerable beam for the downlink antenna. In one embodiment, the antenna system uses metamaterial technology to receive beams and to decode signals from the satellite and to form transmit beams that are directed toward the satellite. In one embodiment, the antenna systems are analog systems, in contrast to antenna systems that employ digital signal processing to electrically form and steer beams (such as phased array antennas). In one embodiment, the antenna system is considered a "surface" antenna that is planar and relatively low profile, especially when compared to conventional satellite dish receivers.

Cell Placement

Figure 17:
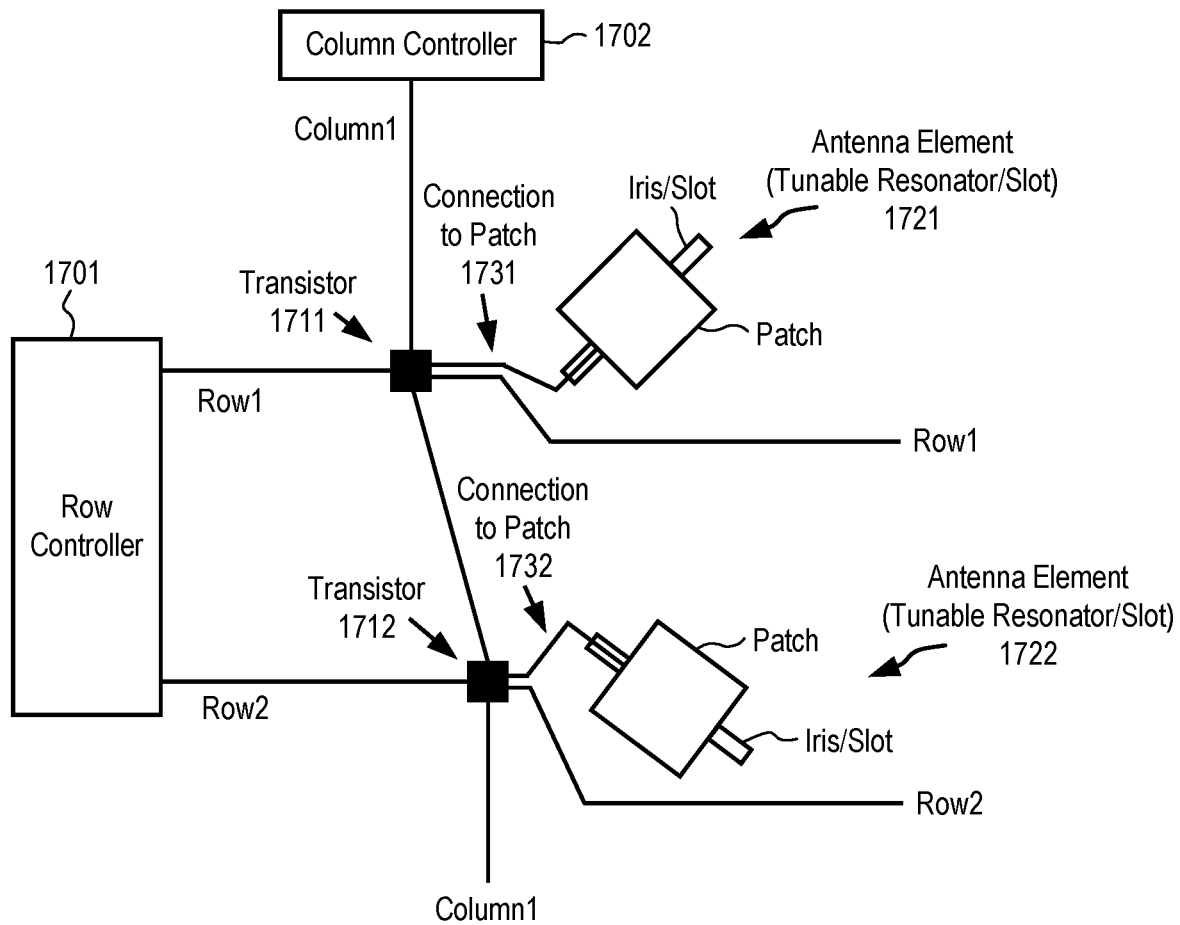
FIG. 17 illustrates one embodiment of the placement of matrix drive circuitry with respect to antenna elements.

In one embodiment, the antenna elements are placed on the cylindrical feed antenna aperture in a way that allows for a systematic matrix drive circuit. The placement of the cells includes placement of the transistors for the matrix drive. FIG. 17 illustrates one embodiment of the placement of matrix drive circuitry with respect to antenna elements. Referring to FIG. 17, row controller 1701 is coupled to transistors 1711 and 1712, via row select signals Row1 and Row2, respectively, and column controller 1702 is coupled to transistors 1711 and 1712 via column select signal Column1. Transistor 1711 is also coupled to antenna element 1721 via connection to patch 1731, while transistor 1712 is coupled to antenna element 1722 via connection to patch 1732.

In an initial approach to realize matrix drive circuitry on the cylindrical feed antenna with unit cells placed in a non-regular grid, two steps are performed. In the first step, the cells are placed on concentric rings and each of the cells is connected to a transistor that is placed beside the cell and acts as a switch to drive each cell separately. In the second step, the matrix drive circuitry is built in order to connect every transistor with a unique address as the matrix drive approach requires. Because the matrix drive circuit is built by row and column traces (similar to LCDs) but the cells are placed on rings, there is no systematic way to assign a unique address to each transistor. This mapping problem results in very complex circuitry to cover all the transistors and leads to a significant increase in the number of physical traces to accomplish the routing. Because of the high density of cells, those traces disturb the RF performance of the antenna due to coupling effect. Also, due to the complexity of traces and high packing density, the routing of the traces cannot be accomplished by commercially available layout tools.

FIGS. 16A-D illustrate one embodiment of the different layers for creating the slotted array. The antenna array includes antenna elements that are positioned in rings, such as the example rings shown in FIG. 1. Note that in this example the antenna array has two different types of antenna elements that are used for two different types of frequency bands.

Figure 16A:
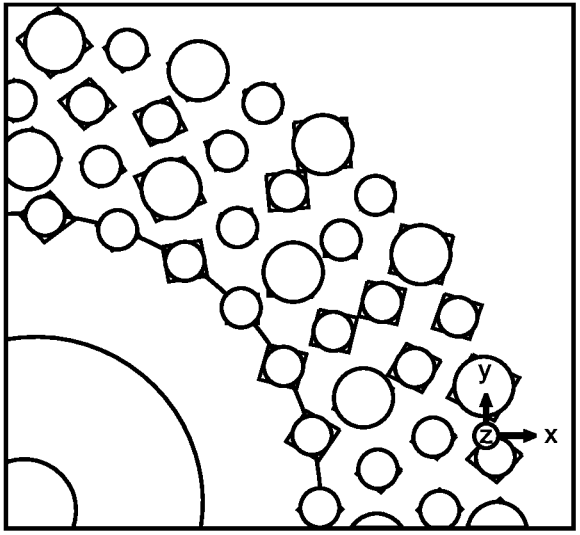
FIGS. 16A-D illustrate one embodiment of the different layers for creating the slotted array.
Figure 16B:
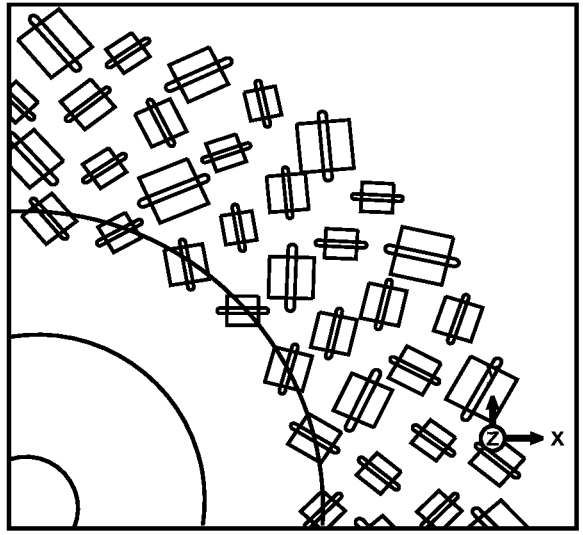
Figure 16C:
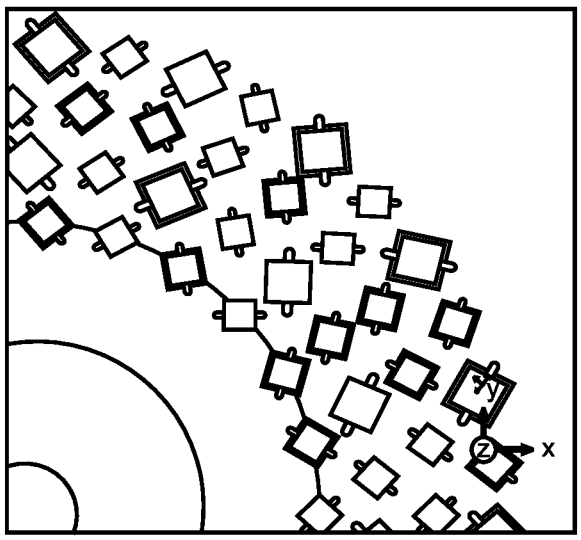
Figure 16D:
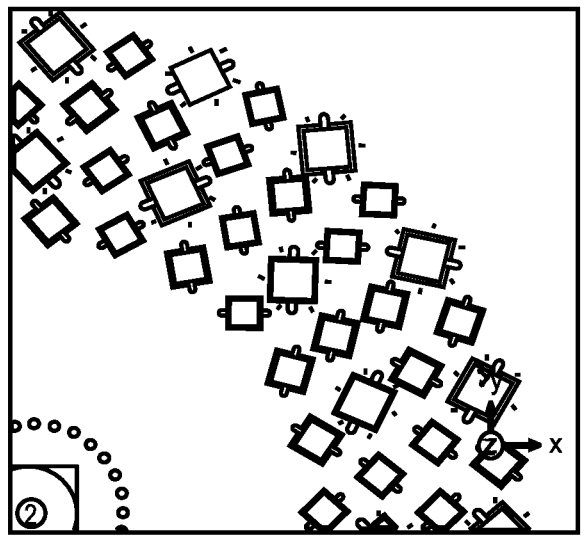

FIG. 16A illustrates a portion of the first iris board layer with locations corresponding to the slots. Referring to FIG. 16A, the circles are open areas/slots in the metallization in the bottom side of the iris substrate, and are for controlling the coupling of elements to the feed (the feed wave). Note that this layer is an optional layer and is not used in all designs. FIG. 16B illustrates a portion of the second iris board layer containing slots. FIG. 16C illustrates patches over a portion of the second iris board layer. FIG. 16D illustrates a top view of a portion of the slotted array.

In one embodiment, the matrix drive circuitry is predefined before the cells and transistors are placed. This ensures a minimum number of traces that are necessary to drive all the cells, each with a unique address. This strategy reduces the complexity of the drive circuitry and simplifies the routing, which subsequently improves the RF performance of the antenna.

More specifically, in one approach, in the first step, the cells are placed on a regular rectangular grid composed of rows and columns that describe the unique address of each cell. In the second step, the cells are grouped and transformed to concentric circles while maintaining their address and connection to the rows and columns as defined in the first step. A goal of this transformation is not only to put the cells on rings but also to keep the distance between cells and the distance between rings constant over the entire aperture. In order to accomplish this goal, there are several ways to group the cells.

Figure 18:
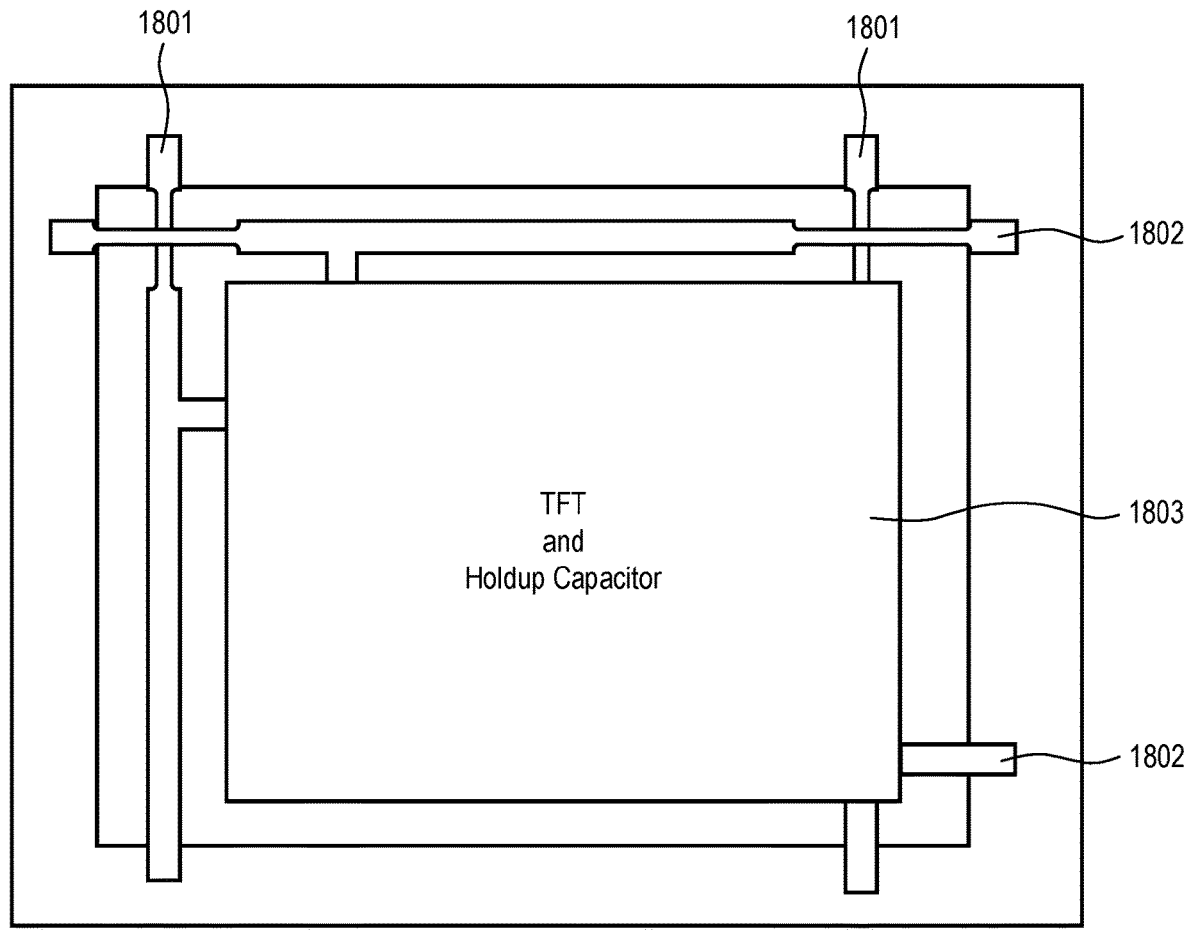
FIG. 18 illustrates one embodiment of a TFT package.

In one embodiment, a TFT package is used to enable placement and unique addressing in the matrix drive. FIG. 18 illustrates one embodiment of a TFT package. Referring to FIG. 18, a TFT and a hold capacitor 1803 is shown with input and output ports. There are two input ports connected to traces 1801 and two output ports connected to traces 1802 to connect the TFTs together using the rows and columns. In one embodiment, the row and column traces cross in 90° angles to reduce, and potentially minimize, the coupling between the row and column traces. In one embodiment, the row and column traces are on different layers.

An Example System Embodiment

In one embodiment, antenna apertures are combined and used in a television system that operates in conjunction with a set top box. For example, in the case of a dual reception antenna, satellite signals received by the antenna are provided to a set top box (e.g., a DirecTV receiver) of a television system. More specifically, the combined antenna operation is able to simultaneously receive RF signals at two different frequencies and/or polarizations. That is, one sub-array of elements is controlled to receive RF signals at one frequency and/or polarization, while another sub-array is controlled to receive signals at another, different frequency and/or polarization. These differences in frequency or polarization represent different channels being received by the television system. Similarly, the two antenna arrays can be controlled for two different beam positions to receive channels from two different locations (e.g., two different satellites) to simultaneously receive multiple channels.

FIG. 19 is a block diagram of one embodiment of a communication system that performs dual reception simultaneously in a television system. Referring to FIG. 19, antenna 1401 includes two spatially interleaved antenna apertures operable independently to perform dual reception simultaneously at different frequencies and/or polarizations as described above. Note that while only two spatially interleaved antenna operations are mentioned, the TV system may have more than two antenna apertures (e.g., 3, 4, 5, etc. antenna apertures).

In one embodiment, antenna 1401, including its two interleaved slotted arrays, is coupled to diplexer 1430. The coupling may include one or more feeding networks that receive the signals from elements of the two slotted arrays to produce two signals that are fed into diplexer 1430. In one embodiment, diplexer 1430 is a commercially available diplexer (e.g., model PB1081WA Ku-band sitcom diplexor from A1 Microwave).

Diplexer 1430 is coupled to a pair of low noise block down converters (LNBs) 1426 and 1427, which perform a noise filtering function, a down conversion function, and amplification in a manner well-known in the art. In one embodiment, LNBs 1426 and 1427 are in an out-door unit (ODU). In another embodiment, LNBs 1426 and 1427 are integrated into the antenna apparatus. LNBs 1426 and 1427 are coupled to a set top box 1402, which is coupled to television 1403.

Set top box 1402 includes a pair of analog-to-digital converters (ADCs) 1421 and 1422, which are coupled to LNBs 1426 and 1427, to convert the two signals output from diplexer 1430 into digital format.

Once converted to digital format, the signals are demodulated by demodulator 1423 and decoded by decoder 1424 to obtain the encoded data on the received waves. The decoded data is then sent to controller 1425, which sends it to television 1403.

Controller 1450 controls antenna 1401, including the interleaved slotted array elements of both antenna apertures on the single combined physical aperture.

An Example of a Full Duplex Communication System

In another embodiment, the combined antenna apertures are used in a full duplex communication system. FIG. 20 is a block diagram of another embodiment of a communication system having simultaneous transmit and receive paths. While only one transmit path and one receive path are shown, the communication system may include more than one transmit path and/or more than one receive path.

Referring to FIG. 20, antenna 1401 includes two spatially interleaved antenna arrays operable independently to transmit and receive simultaneously at different frequencies as described above. In one embodiment, antenna 1401 is coupled to diplexer 1445. The coupling may be by one or more feeding networks. In one embodiment, in the case of a radial feed antenna, diplexer 1445 combines the two signals and the connection between antenna 1401 and diplexer 1445 is a single broad-band feeding network that can carry both frequencies.

Diplexer 1445 is coupled to a low noise block down converter (LNBs) 1427, which performs a noise filtering function and a down conversion and amplification function in a manner well-known in the art. In one embodiment, LNB 1427 is in an out-door unit (ODU). In another embodiment, LNB 1427 is integrated into the antenna apparatus. LNB 1427 is coupled to a modem 1460, which is coupled to computing system 1440 (e.g., a computer system, modem, etc.).

Modem 1460 includes an analog-to-digital converter (ADC) 1422, which is coupled to LNB 1427, to convert the received signal output from diplexer 1445 into digital format. Once converted to digital format, the signal is demodulated by demodulator 1423 and decoded by decoder 1424 to obtain the encoded data on the received wave. The decoded data is then sent to controller 1425, which sends it to computing system 1440.

Modem 1460 also includes an encoder 1430 that encodes data to be transmitted from computing system 1440. The encoded data is modulated by modulator 1431 and then converted to analog by digital-to-analog converter (DAC) 1432. The analog signal is then filtered by a BUC (up-convert and high pass amplifier) 1433 and provided to one port of diplexer 1445. In one embodiment, BUC 1433 is in an out-door unit (ODU).

Diplexer 1445 operating in a manner well-known in the art provides the transmit signal to antenna 1401 for transmission.

Controller 1450 controls antenna 1401, including the two arrays of antenna elements on the single combined physical aperture.

Note that the full duplex communication system shown in FIG. 20 has a number of applications, including but not limited to, internet communication, vehicle communication (including software updating), etc.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; etc.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

We claim:

1. A method for using an antenna, the method comprising:
   receiving position data indicative of an antenna aperture of an antenna after the antenna has been placed in a position to increase capture of solar energy by one or more photovoltaic (PV) structures integrated onto one of a pair of optically transparent substrates of the antenna aperture containing an array of antenna elements, wherein the pair of optically transparent substrates comprises a plurality of slots and a plurality of patches, wherein each of the patches is co-located over and separated from a slot in the plurality of slots by a metamaterial element, wherein the one or more PV structures are located between antenna elements in the array and are connected using a patch metal layer on the one optically transparent substrate; and
   in response to the position data, electronically steering the array of antenna elements of the antenna to redirect a beam toward a satellite based on the position of the antenna while maintaining the position of the antenna for increased capture of the solar energy.

2. The method defined in claim 1 further comprising:
   powering up the antenna based at least in part on the solar energy captured by the one or more PV structures.

3. The method defined in claim 1 further comprising:
   locating the satellite in response to electronically steering the array of antenna elements; and
   locking onto the satellite while the antenna is in the position for increased capture of the solar energy.

4. The method defined in claim 1 further comprising using communication between the antenna and the satellite to connect to a communication network.

5. The method defined in claim 4 wherein the communication network comprises the internet.

6. The method defined in claim 4 wherein the communication includes a WiFi signal.

7. The method defined in claim 1 wherein positioning the antenna comprises:
   rotating the antenna between a plurality of positions;
   recording amounts of solar energy capture at each of the plurality of positions; and
   determining a direction to point the antenna automatically based on the amounts of solar energy capture; and
   automatically moving the antenna into the position based on the direction.

8. The method defined in claim 1 further comprising:
   unfolding at least one appendage attached to the antenna and having one or more PV structures; and
   capturing solar energy with the one or more PV structures of the at least one appendage.

9. The method defined in claim 1 further comprising trickle charging a battery supplying power to the antenna using solar energy captured by the one or more PV structures.

10. The method defined in claim 9 further comprising performing a warm start using the battery trickle charged with energy captured by the one or more PV structures.

11. The method defined in claim 9 wherein the battery is used for emergency power or disaster recovery.

12. The method defined in claim 1 further comprising using communication between the antenna and the satellite to connect to a communication network during an emergency mode.

13. The method defined in claim 12 wherein the communication occurs only using power from a battery that is charged with captured solar energy.

14. The method defined in claim 12 wherein the communication includes transmission of position data of the antenna.

15. The method defined in claim 14 wherein the position data comprises global positioning system (GPS) data.

16. The method defined in claim 12 wherein the communication includes an emergency code.

17. The method defined in claim 1 wherein the photovoltaic structures comprise at least one photovoltaic cell.

18. An antenna comprising:
   a physical antenna aperture having an array of antenna elements and one or more PV structures integrated onto one of a pair of optically transparent substrates of the aperture to capture solar energy to provide power for the antenna, wherein the pair of optically transparent substrates comprises a plurality of slots and a plurality of patches, wherein each of the patches is co-located over and separated from a slot in the plurality of slots by a metamaterial element, wherein the one or more PV structures are located between antenna elements in the array and are connected using a patch metal layer on the one optically transparent substrate; and
   a controller to cause the array of antenna elements to be electronically scanned to produce a beam at a desired frequency using a control algorithm taking into account the position of the physical aperture for capture of solar energy by the one or more photovoltaic (PV) structures.

19. The antenna defined in claim 18 wherein at least one of the one or more PV structures is located in a peripheral area outside the array of antenna elements.

20. The antenna defined in claim 19 wherein the peripheral area comprises a bezel on the aperture.

21. The antenna defined in claim 18 wherein at least one of the one or more PV structures is located on a substrate that includes the array of antenna elements.

22. The antenna defined in claim 21 wherein the substrate comprises a glass layer.

23. The antenna defined in claim 18 wherein the one or more PV structures are interleaved between antenna elements.

24. The antenna defined in claim 18 further comprising:
   antenna element drive circuitry to drive antenna elements; and
   an energy harvesting subsystem to collect energy captured by the one or more PV structures and provide power to the antenna element drive circuitry.

25. The antenna defined in claim 24 wherein the antenna element drive circuitry comprises row and column routing, and further wherein multiple PV structures of the one or more PV structures are between the row and column routing conductors.

26. The antenna defined in claim 24 wherein the antenna element drive circuitry comprises thin-film transistors (TFTs).

27. The antenna defined in claim 18 wherein elements in each of the tunable slotted arrays are positioned in two or more rings, and further wherein multiple PV structures of the one or more PV structures are between the two or more rings.

28. The antenna defined in claim 18 wherein the one or more PV structures comprise one or more selected from a group comprising amorphous silicon PV cells, multijunction PV cells, and triple junction PV cells.

29. The antenna defined in claim 18 wherein the one or more PV structures comprise a plurality of PV cells having different sizes.

30. The antenna defined in claim 18 wherein the antenna elements that are controlled and operable together to form a beam for the frequency band for use in holographic beam steering.

31. The antenna defined in claim 18 wherein
each of the patches and its co-located slot form a patch/slot pair, each patch/slot pair being turned off or on based on application of a voltage to the patch in the pair; and wherein the controller is operable to apply a control pattern to control which patch/slot pairs are on and off to generate the beam.

32. The antenna defined in claim 31 wherein the metamaterial element comprises liquid crystal.

33. The antenna defined in claim 32 wherein the metamaterial element is UV sensitive, and further comprising a UV absorption layer over a least a portion of the aperture to reduce an amount of UV radiation exposed to the LC.

34. The antenna defined in claim 32 wherein the metamaterial element is UV sensitive, and further comprising an optically opaque layer on top of a substrate UV filter over a least a portion of the aperture to prevent UV radiation from impacting the LC.

35. The antenna defined in claim 34 wherein the optically opaque layer includes an opening for each of the PV elements in the array.

36. The antenna defined in claim 18 wherein the one or more PV structures comprises groups of PV cells electrically connected in series with the groups electrically connected in parallel.

37. The antenna defined in claim 36 wherein the groups are connected to a patch metal layer that is operable to distribute power to drive circuitry for the antenna elements.

38. An antenna comprising:
a physical antenna aperture having an array of antenna elements and one or more PV structures integrated onto a surface of one of a pair of optically transparent substrates of the aperture within and outside the array to capture solar energy to provide power for the antenna, wherein the array of antenna elements comprises a tunable slotted array of antenna elements a plurality of slots and a plurality of patches on the pair of optically transparent substrates, wherein each of the patches is co-located over and separated from a slot in the plurality of slots by a metamaterial element, forming a patch/slot pair, each patch/slot pair being turned off or on based on application of a voltage to the patch in the pair, wherein the one or more PV structures are located between antenna elements in the array and are connected using a patch metal layer on the one optically transparent substrate; and
a controller to cause the array of antenna elements to be electronically scanned to produce a beam at a desired frequency using a control algorithm taking into account the position of the physical aperture for capture of solar energy by the one or more photovoltaic (PV) structures, wherein the controller is operable to apply a control pattern to control which patch/slot pairs are on and off to generate the beam.

* * * * *